United States Patent
Guan et al.

(10) Patent No.: US 12,191,250 B2
(45) Date of Patent: Jan. 7, 2025

(54) METHOD OF FORMING BOTTOM ELECTRODE VIA FOR MEMORY DEVICE

(71) Applicant: Taiwan Semiconductor Manufacturing Company, Ltd., Hsinchu (TW)

(72) Inventors: Zhen Yu Guan, Changhua County (TW); Sheng-Wen Fu, Hsinchu (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 396 days.

(21) Appl. No.: 17/725,906

(22) Filed: Apr. 21, 2022

(65) Prior Publication Data
US 2023/0238318 A1 Jul. 27, 2023

Related U.S. Application Data

(60) Provisional application No. 63/303,801, filed on Jan. 27, 2022.

(51) Int. Cl.
*H01L 23/522* (2006.01)
*G11C 11/16* (2006.01)
(Continued)

(52) U.S. Cl.
CPC ........ *H01L 23/5226* (2013.01); *G11C 11/161* (2013.01); *H01L 21/76831* (2013.01);
(Continued)

(58) Field of Classification Search
CPC .......... H01L 23/5226; H01L 21/76831; H01L 23/528; H01L 21/3212; H01L 21/7684;
(Continued)

(56) References Cited

U.S. PATENT DOCUMENTS

| | | | |
|---|---|---|---|
| 2006/0105565 A1* | 5/2006 | Liu | .......................... C25D 3/38 257/E21.585 |
| 2011/0189855 A1* | 8/2011 | Lin | ........................ H01L 21/306 438/692 |

(Continued)

FOREIGN PATENT DOCUMENTS

| | | |
|---|---|---|
| CN | 114421909 A | 12/2021 |
| DE | 19757119 A1 | 7/1999 |

*Primary Examiner* — Mohammed R Alam
(74) *Attorney, Agent, or Firm* — Eschweiler & Potashnik, LLC

(57) ABSTRACT

The present disclosure relates integrated chip structure. The integrated chip structure includes a lower insulating structure disposed over a lower dielectric structure surrounding one or more lower interconnects. A bottom electrode via surrounded by one or more interior sidewalls of the lower insulating structure. The bottom electrode via includes a barrier surrounding a conductive core. A bottom electrode is arranged on the bottom electrode via, a data storage structure is over the bottom electrode, and a top electrode is over the data storage structure. The barrier includes a sidewall disposed along the one or more interior sidewalls of the lower insulating structure and a horizontally covering segment protruding outward from the sidewall to above a top surface of the lower insulating structure.

20 Claims, 14 Drawing Sheets

(51) Int. Cl.
 *H01L 21/768* (2006.01)
 *H01L 23/528* (2006.01)
 *H10N 50/01* (2023.01)
 *H10N 50/10* (2023.01)
 *H10N 50/80* (2023.01)

(52) U.S. Cl.
 CPC .......... *H01L 23/528* (2013.01); *H10N 50/01* (2023.02); *H10N 50/10* (2023.02); *H10N 50/80* (2023.02)

(58) Field of Classification Search
 CPC ......... H01L 21/76843; H01L 21/76877; H01L 23/5283; H01L 23/535; G11C 11/161; H10N 50/01; H10N 50/10; H10N 50/80; H10B 61/22; H10B 61/00

See application file for complete search history.

(56) References Cited

U.S. PATENT DOCUMENTS

| | | |
|---|---|---|
| 2017/0092591 A1 | 3/2017 | Fu et al. |
| 2019/0157548 A1 | 5/2019 | Wu et al. |
| 2020/0006638 A1 | 1/2020 | Chen et al. |
| 2020/0106008 A1 | 4/2020 | Peng et al. |
| 2020/0127047 A1 | 4/2020 | Chen et al. |
| 2020/0303629 A1 | 9/2020 | Chuang et al. |
| 2021/0057639 A1 | 2/2021 | Ku et al. |
| 2021/0273156 A1 | 9/2021 | Chen et al. |
| 2021/0343932 A1 | 11/2021 | Sung et al. |
| 2021/0384413 A1 | 12/2021 | Chang et al. |
| 2021/0391532 A1 | 12/2021 | Yin et al. |
| 2021/0398809 A1 | 12/2021 | Yamazaki |
| 2022/0020917 A1 | 1/2022 | Chang et al. |

* cited by examiner

METHOD OF FORMING BOTTOM ELECTRODE VIA FOR MEMORY DEVICE

REFERENCE TO RELATED APPLICATION

This application claims the benefit of U.S. Provisional Application No. 63/303,801, filed on Jan. 27, 2022, the contents of which are hereby incorporated by reference in their entirety.

BACKGROUND

Many modern-day electronic devices contain electronic memory configured to store data. Electronic memory may be volatile memory or non-volatile memory. Volatile memory stores data when it is powered, while non-volatile memory is able to store data when power is removed. Magnetoresistive random-access memory (MRAM) is one promising candidate for a next generation non-volatile memory technology. MRAM devices use magnetic tunnel junctions (MTJs) to store data in a manner that allows for high-speed data access and low power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
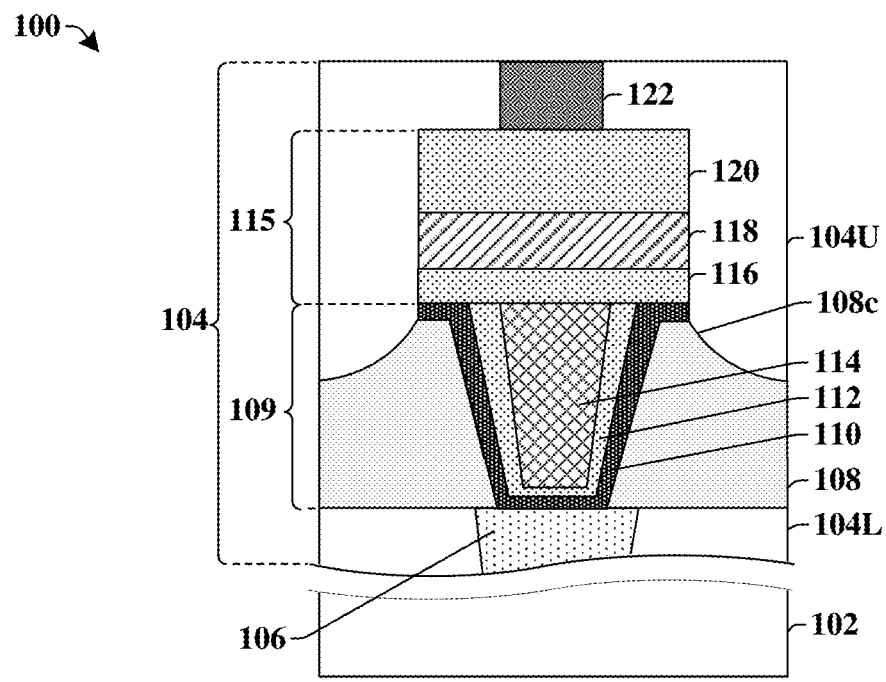
FIG. 1 illustrates a cross-sectional view of some embodiments of an integrated chip structure comprising a memory device disposed over a multi-layered bottom electrode via with a relatively flat upper surface.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random-access memory (MRAM) devices comprise a magnetic tunnel junction (MTJ) structure vertically arranged within a back-end-of-the-line (BEOL) interconnect stack between a lower electrode and an upper electrode. The MTJ comprises a pinned layer and a free layer, which are vertically separated by a tunnel barrier layer. The magnetic orientation of the pinned layer is static (i.e., fixed), while a magnetic orientation of the free layer is capable of switching between a parallel configuration and an anti-parallel configuration with respect to that of the pinned layer. The parallel configuration provides for a low resistance state that digitally stores data as a first data state (e.g., a logical "0"). The anti-parallel configuration provides for a high resistance state that digitally stores data as a second data state (e.g., a logical "1").

The bottom electrode of an MRAM device may be disposed over a bottom electrode via, which couples the bottom electrode to an underlying lower interconnect. The bottom electrode via may be formed by depositing a lower insulating structure over the lower interconnect and subsequently patterning the lower insulating structure to form a bottom electrode via opening that exposes the lower interconnect. A glue layer is formed within the bottom electrode via opening followed by a conductive material being formed onto the glue layer and within the bottom electrode via opening. A chemical mechanical planarization (CMP) process is then performed to remove excess of the conductive material and the glue layer from over the lower insulating structure. It has been appreciated that as a size of the bottom electrode via decreases (e.g., to nodes of 16 nm or lower), fang defects (e.g., divots arranged along opposing top outer corners of the conductive material) may become more prevalent along outer edges of the conductive material that face the glue layer. This is because the conductive material (e.g., tungsten) may have a lower corrosion potential than the glue layer (e.g., TiN), thereby causing galvanic corrosion to occur between the conductive material and the glue layer in the presence of a CMP slurry (e.g., an electrolyte). The galvanic corrosion causes an oxide along outer edges of the conductive material. The oxide will be subsequently removed during the CMP process leaving fang defects.

It has also been appreciated that fang defects within a bottom electrode via will cause problems in overlying layers of an MRAM device. For example, fang defects may impact a grain orientation of an overlying bottom electrode, and thus increase a roughness of the bottom electrode. The increased roughness of the bottom electrode will cause an increased roughness of an MTJ's pinned layer, which can degrade performance of the MTJ (e.g., due to the formation of defects within an overlying magnesium oxide (MgO) tunnel barrier layer). Such degraded performance may lead to increased leakage current, lower tunnel magnetoresistance (TMR), a smaller read window, and/or failure of an associated MRAM device.

The present disclosure relates to an integrated chip structure comprising a memory device disposed over a multi-layered bottom electrode via with a relatively flat upper surface. In some embodiments, the integrated chip structure comprises a lower insulating structure disposed over a lower dielectric structure surrounding one or more lower interconnects. A bottom electrode via is arranged directly between one or more interior sidewalls of the lower insulating structure. A bottom electrode is arranged on the bottom electrode via, a data storage structure is arranged over the bottom electrode, and a top electrode is arranged over the data storage structure. The bottom electrode via comprises a glue layer arranged along the one or more interior sidewalls of the lower insulating structure and surrounding a conductive core. The bottom electrode via is formed by a mechanical polishing process that utilizes a first slurry followed by a subsequent buffing process that is utilizes a second slurry that is devoid of an oxidizer. By performing the buffing process with a slurry that is devoid of an oxidizer, galvanic corrosion is reduced along outer edges of the conductive core thereby reducing fang defects within the conductive core. By reducing fang defects within the conductive core, the bottom electrode via achieves a relatively flat upper surface that mitigates defects within an overlying data storage layer (e.g., magnetic tunnel junction structure).

FIG. 1 illustrates a cross-sectional view of some embodiments of an integrated chip structure 100 comprising a memory device disposed over a multi-layered bottom electrode via with a relatively flat upper surface.

The integrated chip structure 100 comprises a lower dielectric structure 104L disposed over a substrate 102. The lower dielectric structure 104L surrounds one or more lower interconnects 106. A lower insulating structure 108 is arranged over the lower dielectric structure 104L. The lower insulating structure 108 comprises one or more interior sidewalls that extend between a top surface of the lower insulating structure and a bottom surface of the lower insulating structure 108. The lower insulating structure 108 further comprises one or more curved outer sidewalls 108c that face away from the one or more interior sidewalls. The one or more curved outer sidewalls 108c are coupled to the top surface of the lower insulating structure 108.

A bottom electrode via 109 is arranged directly between the one or more interior sidewalls of the lower insulating structure 108. The bottom electrode via 109 continuously extends from directly between the one or more interior sidewalls of the lower insulating structure 108 to over the top surface of the lower insulating structure 108. The bottom electrode via 109 comprises a barrier 110 that continuously extends from along the one or more interior sidewalls of the lower insulating structure 108 to over the top surface of the lower insulating structure 108. The barrier 110 comprises a sidewall extending along the one or more interior sidewalls of the lower insulating structure 108 and a horizontally extending segment (e.g., a horizontally covering segment) protruding outward from the sidewall to above a topmost surface of the lower insulating structure. A glue layer 112 is arranged on the barrier 110 and a conductive core 114 is arranged on the glue layer 112. The glue layer 112 laterally and vertically separates the barrier 110 from the conductive core 114. In some embodiments, the barrier 110 vertically extends to topmost surfaces of the glue layer 112 and the conductive core 114. In some embodiments, topmost surfaces of the barrier 110, the glue layer 112, and the conductive core 114 are substantially co-planar.

A memory device 115 is disposed over the bottom electrode via 109. The memory device 115 comprises a bottom electrode 116 separated from a top electrode 120 by a data storage structure 118. The bottom electrode 116 has a lower surface that physically contacts the topmost surfaces of the barrier 110, the glue layer 112, and the conductive core 114. In some embodiments, the lower surface of the bottom electrode 116 laterally extends past outermost sidewalls of the glue layer 112 and the conductive core 114.

An upper dielectric structure 104U is arranged along the curved outer sidewalls 108c of the lower insulating structure 108 and along opposing sides of the bottom electrode via 109 and the memory device 115. In some embodiments, the upper dielectric structure 104U may physically contact the curved outer sidewalls 108c of the lower insulating structure 108 and the opposing sides of the bottom electrode via 109 and the memory device 115. An upper interconnect structure 122 extends through the upper dielectric structure 104U to contact the top electrode 120.

In some embodiments, the conductive core 114 may comprise or be a material that has a lower corrosion potential than that of a material of the glue layer 112. For example, the conductive core 114 may comprise and/or be tungsten, while the glue layer 112 may comprise and/or be titanium. As the size of the bottom electrode via 109 decreases, tungsten is able to provide the conductive core 114 with good electrical characteristics (e.g., resistivity, electromigration, etc.), low diffusivity, and good gap fill capabilities. However, due to the difference in corrosion between the conductive core 114 and the glue layer 112, tungsten is susceptible to the formation of fang defects along its outer edges in the presence of an electrolyte (e.g., a CMP slurry with an oxidizer). The disclosed bottom electrode via 109 is formed by a process that utilizes a buffing process to minimize the formation of fang defects along outer edges of the conductive core 114, thereby causing the topmost surface of the conductive core 114 to be substantially co-planar with the topmost surfaces of the barrier 110 and the glue layer 112. Minimizing fang defects within the conductive core 114 improves electrical characteristics of the bottom electrode 116 and/or data storage structure 118, thereby improving operation of the memory device 115.

Figure 2:
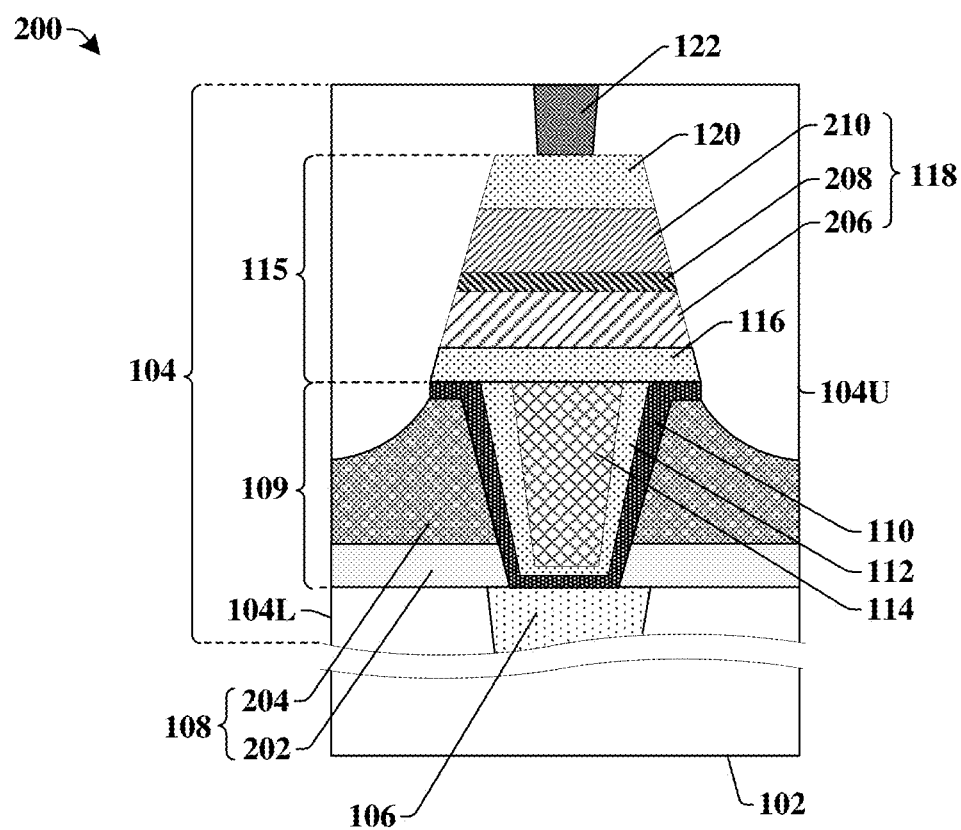
FIG. 2 illustrates a cross-sectional view of some additional embodiments of an integrated chip structure comprising a magnetic random-access memory (MRAM) device disposed over a disclosed multi-layered bottom electrode via.

FIG. 2 illustrates a cross-sectional view of some additional embodiments of an integrated chip structure 200 comprising a magnetic random-access memory (MRAM) device disposed over a multi-layered bottom electrode via with a relatively flat upper surface.

The integrated chip structure 200 comprises a lower insulating structure 108 arranged over a lower dielectric structure 104L surrounding one or more lower interconnects 106 over a substrate 102. The lower insulating structure 108 comprises one or more interior sidewalls that extend between a topmost surface and a bottommost surface of the lower insulating structure 108. In some embodiments, the lower insulating structure 108 comprises a plurality of dielectric layers stacked onto one another. For example, in some embodiments, the lower insulating structure 108 may comprise a first lower insulating layer 202 and a second lower insulating layer 204 over the first lower insulating layer 202.

In some embodiments, the first lower insulating layer 202 may comprise a carbide (e.g., silicon carbide), a nitride (e.g., silicon nitride), or the like. In some embodiments, the second lower insulating layer 204 may comprise an oxide, such as silicon rich oxide (SRO), silicon dioxide, or the like. In some embodiments, the first lower insulating layer 202 may have a thickness that is in a range of between approximately 100 Angstroms (Å) and approximately 200 Å, between approximately 125 Å and approximately 150 Å, approximately 150 Å, or other similar values. In some embodiments, the second lower insulating layer 204 may have a thickness that is in a range of between approximately 250 Å and approximately 1000 Å, between approximately 500 Å and approximately 900 Å, approximately 800 Å, approximately 550 Å, or other similar values.

A bottom electrode via 109 is arranged directly between the one or more interior sidewalls of the lower insulating structure 108. The bottom electrode via 109 comprises a barrier 110, a glue layer 112 on the barrier 110, and a conductive core 114 on the glue layer 112. In some embodiments, the barrier 110 comprises a sidewall that extends along the one or more interior sidewalls of the lower insulating structure 108 and a horizontally extending surface that protrudes outward from the sidewall to over the topmost surface of the lower insulating structure 108.

In some embodiments, the barrier 110 may comprise a metal nitride such as titanium nitride, tantalum nitride, or the like. In some embodiments, the barrier 110 may have a thickness that is in a range of between approximately 25 Å and approximately 100 Å, between approximately 50 Å and approximately 85 Å, approximately 80 Å, or other similar values. In some embodiments, the thickness of the barrier 110 along the sidewall may be different (e.g., larger than) the thickness of the barrier along the horizontally extending surface. In some embodiments, the glue layer 112 may comprise a metal nitride such as titanium nitride, tantalum nitride, or the like. In some embodiments, the glue layer 112 may have a thickness that is in a range of between approximately 50 Å and approximately 100 Å, between approximately 50 Å and approximately 75 Å, approximately 60 Å, or other similar values. In some embodiments, the conductive core 114 may comprise and/or be tungsten, copper, or the like. In some embodiments, the conductive core 114 may have a height that is in a range of between approximately 500 Å and approximately 1500 Å, between approximately 750 Å and approximately 1000 Å, approximately 1000 Å, or other similar values.

A memory device 115 is disposed over the bottom electrode via 109. The memory device 115 comprises a bottom electrode 116 separated from a top electrode 120 by a data storage structure 118. The bottom electrode 116 has a lower surface that physically contacts topmost surfaces of the barrier 110, the glue layer 112, and the conductive core 114. In some embodiments, the bottom electrode 116 and/or the top electrode 120 may comprise a metal (e.g., tantalum, titanium, tungsten, or the like), a metal nitride (e.g., tantalum nitride, titanium nitride, or the like), or the like. In some embodiments, the glue layer 112 and the bottom electrode 116 may comprise or be a same material.

In some embodiments, the bottom electrode 116 may have outer sidewalls that are sloped to have slopes that are substantially equal to slopes of outer sidewalls of the data storage structure 118 and/or the top electrode 120. In other embodiments, the bottom electrode 116 may have outer sidewalls that are sloped to have slopes that are different than slopes of the outer sidewalls of the data storage structure 118 and/or the top electrode 120. In some embodiments, the bottom electrode via 109 may have outer sidewalls that are sloped to have slopes that are substantially equal to slopes of the outer sidewalls of the bottom electrode 116, the data storage structure 118, and/or the top electrode 120. In other embodiments, the bottom electrode via 109 may have outer sidewalls that are sloped to have slopes that are different than slopes of the outer sidewalls of the bottom electrode 116, the data storage structure 118, and/or the top electrode 120.

In some embodiments, the data storage structure 118 may comprise a magnetic tunnel junction (MTJ) structure. In such embodiments, the data storage structure 118 may comprise a pinned layer 206 separated from a free layer 210 by a dielectric tunnel barrier 208. The pinned layer 206 has a magnetization that is fixed, while the free layer 210 has a magnetization that can be changed during operation (through the tunnel magnetoresistance (TMR) effect) to be either parallel (i.e., a 'P' state) or anti-parallel (i.e., an 'AP' state) with respect to the magnetization of the pinned layer 206. A relationship between the magnetizations of the pinned layer 206 and the free layer 210 form a resistive state of the MTJ and thereby enables the MTJ to store a data state.

An upper dielectric structure 104U is arranged over the lower insulating structure 108 and the memory device 115. In various embodiments, the upper dielectric structure 104U may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material (e.g., porous carbon doped silicon dioxide), or the like. An upper interconnect structure 122 extends through the upper dielectric structure 104U to contact the top electrode 120. In some embodiments, the upper interconnect structure 122 may comprise an interconnect via and/or an interconnect wire. In various embodiments, the upper interconnect structure 122 may comprise copper, tungsten, aluminum, or the like.

Figure 3A:
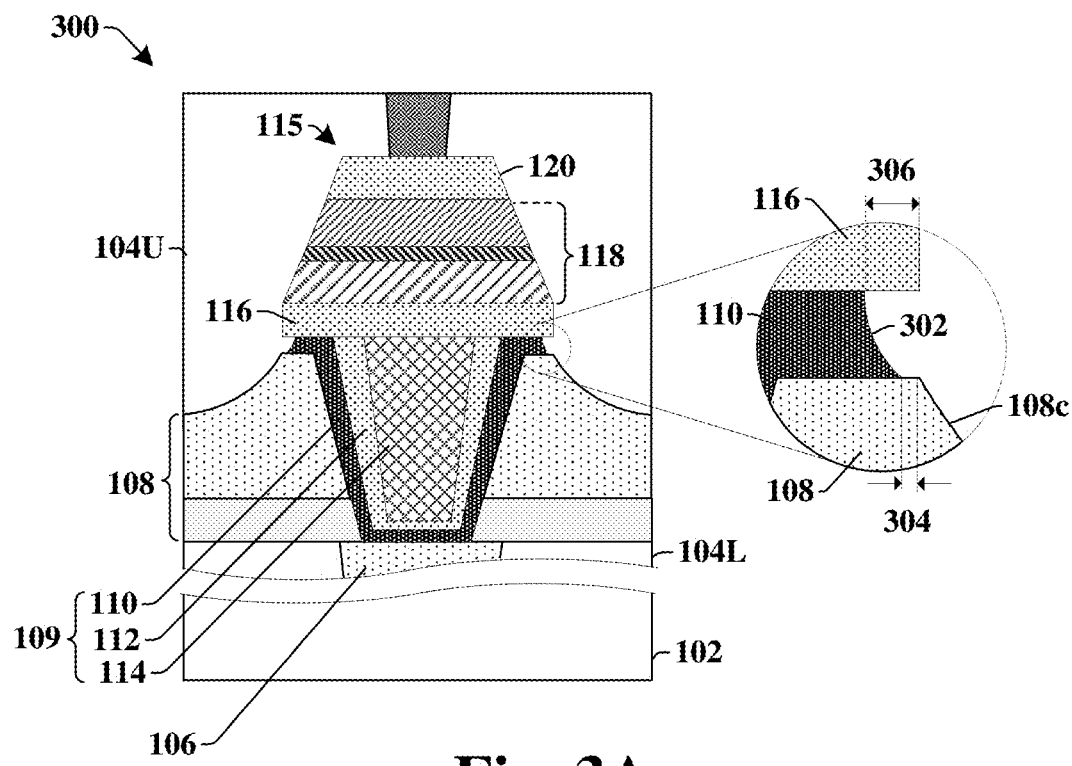
FIGS. 3A-3B illustrate cross-sectional views of some additional embodiments of an integrated chip structure comprising an MRAM device disposed over a disclosed multi-layered bottom electrode via.

FIG. 3A illustrates a cross-sectional view of some additional embodiments of an integrated chip structure 300 comprising an MRAM device disposed over a multi-layered bottom electrode via with a relatively flat upper surface.

The integrated chip structure 300 comprises a lower insulating structure 108 arranged over a lower dielectric structure 104L surrounding one or more lower interconnects 106 over a substrate 102. A bottom electrode via 109 is arranged directly between one or more interior sidewalls of the lower insulating structure 108. The bottom electrode via 109 comprises a barrier 110, a glue layer 112, and a conductive core 114. A memory device 115 is arranged on the bottom electrode via 109. The memory device 115 comprises a bottom electrode 116 separated from a top electrode 120 by a data storage structure 118. The bottom electrode 116 rests on topmost surfaces of the barrier 110, the glue layer 112, and the conductive core 114.

The barrier 110 comprises a sidewall that extends along one or more interior sidewalls of the lower insulating structure 108, a horizontally extending surface that protrudes outward from the sidewall to over a topmost surface of the lower insulating structure 108, and an outermost sidewall 302 that is coupled to the horizontally extending surface. The outermost sidewall 302 of the barrier 110 is directly over the topmost surface of the lower insulating structure 108. In some embodiments, the outermost sidewall 302 of the barrier 110 is laterally set-back from a curved outer sidewall 108c of the lower insulating structure 108 by a first non-zero distance 304. In such embodiments, the topmost surface of the lower insulating structure 108, which is directly coupled to a curved outer sidewall 108c of the lower insulating structure 108, laterally extends past the outermost sidewall 302 of the barrier 110. In some additional embodiments, the outermost sidewall of the barrier 110 is also laterally set-back from an outermost sidewall 302 of the bottom electrode 116 by a second non-zero distance 306, so that the bottom electrode 116 overhangs the barrier 110 (e.g., so that the barrier 110 is undercut to have the outermost sidewall 302 be directly below a lower surface of the bottom electrode 116). In some such embodiments, the upper dielectric structure 104U may vertically contact the upper surface of the lower insulating structure 108 and the lower surface of the bottom electrode 116.

Figure 3B:
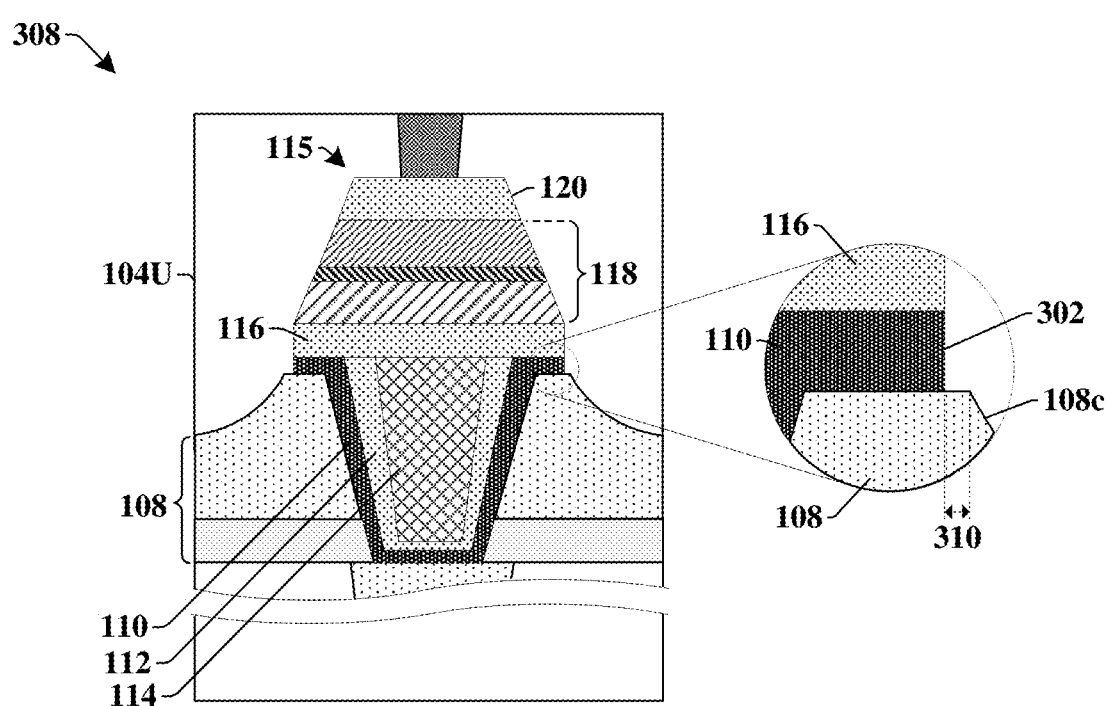

In some alternative embodiments, shown in cross-sectional view 308 of FIG. 3B, the outermost sidewall 302 of the barrier 110 is substantially coplanar with the outermost sidewall of the bottom electrode 116. In some such embodiments, both the outermost sidewall 302 of the barrier 110 and the outermost sidewall of the bottom electrode 116 are laterally set-back from the curved outer sidewalls 108c of the lower insulating structure 108 by a third non-zero distance 310. In some such embodiments, the upper dielectric structure 104U may vertically contact the upper surface of the lower insulating structure 108.

Figure 4:
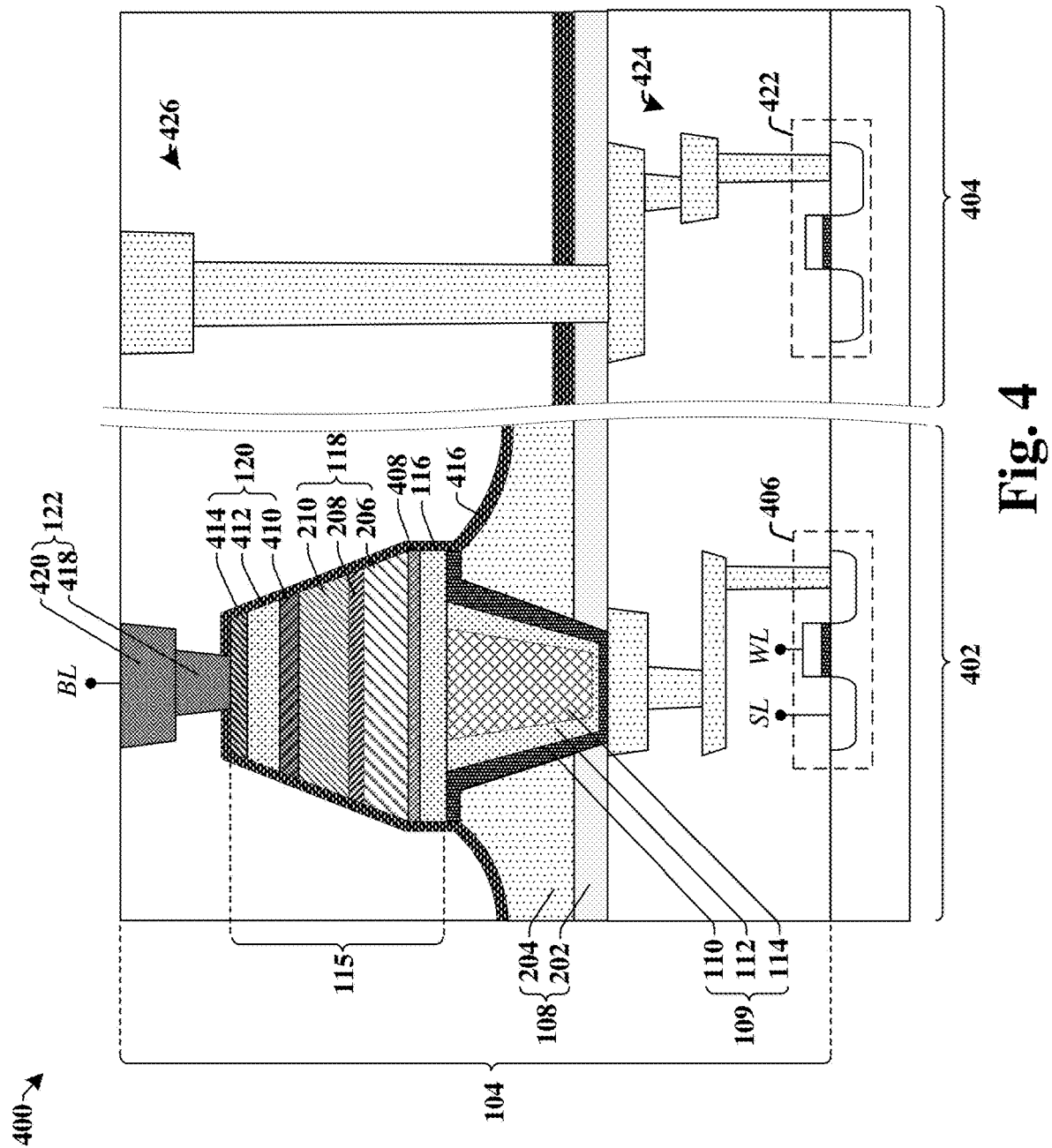
FIG. 4 illustrates a cross-sectional view of some additional embodiments of an integrated chip structure comprising an MRAM device disposed over a disclosed multi-layered bottom electrode via.

FIG. 4 illustrates a cross-sectional view of some additional embodiments of an integrated chip structure 400 comprising an MRAM device disposed over a multi-layered bottom electrode via with a relatively flat upper surface.

The integrated chip structure 400 comprises a substrate 102 having an embedded memory region 402 and a peripheral region 404. Within the embedded memory region 402, a bottom electrode via 109 is arranged within a lower insulating structure 108 over a substrate 102. A memory device 115 is disposed on the bottom electrode via 109. One or more lower interconnects 106 are configured to couple the memory device 115 to an access device 406 arranged on and/or within the substrate 102. In some embodiments, the access device 406 may comprise a MOSFET device (e.g., a planar FET, a FinFET, a gate all around (GAA) device, a nanosheet device, or the like) having a gate structure that is laterally arranged between a source region and a drain region. In some embodiments, the gate structure may comprise a gate electrode that is separated from the substrate 102 by a gate dielectric. In some such embodiments, the source region is coupled to a source-line SL and the gate structure is coupled to a word-line WL. In other embodiments, the access device 406 may comprise a HEMT, a BJT, a JFET, or the like.

The memory device 115 comprises a data storage structure 118 arranged between a bottom electrode 116 and a top electrode 120. The bottom electrode 116 is arranged over the bottom electrode via 109 and a seed layer 408 is arranged over the bottom electrode 116. The seed layer 408 separates the bottom electrode 116 from the data storage structure 118. In some embodiments, the seed layer 408 may comprise a tantalum nitride layer having a thickness of between approximately 10 Å and approximately 40 Å, between approximately 10 Å and approximately 20 Å, approximately 20 Å, or other similar values. In some embodiments, the data storage structure 118 comprises a magnetic tunnel junction (MTJ) structure. In such embodiments, the data storage structure 118 may comprise a pinned layer 206 separated from a free layer 210 by a dielectric tunnel barrier 208. Because the bottom electrode via 109 has a substantially flat upper surface, the seed layer 408 is able to be used to form the pinned layer 206 with a relatively low roughness, thereby mitigating defects in the dielectric tunnel barrier 208 (e.g., an MgO dielectric tunnel barrier).

In some embodiments, the top electrode 120 comprises a multi-layered structure. For example, the top electrode 120 may comprise a first top electrode layer 410, a second top electrode layer 412 on the first top electrode layer 410, and a third top electrode layer 414 on the second top electrode layer 412. In some embodiments, the first top electrode layer 410 may comprise a first metal (e.g., ruthenium), the second top electrode layer 412 may comprise a second metal (e.g., tungsten), and the third top electrode layer 414 may comprise a third metal (e.g., tantalum).

A protective layer 416 covers sidewalls of the memory device 115 and the lower insulating structure 108. In some embodiments, the protective layer 416 may comprise an oxide (e.g., silicon rich oxide, silicon dioxide, etc.), a nitride (e.g., silicon nitride, silicon oxynitride, etc.), a carbide (e.g., silicon carbide, silicon oxycarbide, etc.), or the like. An upper interconnect structure 122 is disposed within an upper dielectric structure 104U over the protective layer 416. The upper interconnect structure 122 extends from an upper surface of the upper dielectric structure 104U to the top electrode 120. In some embodiments, the upper interconnect structure 122 may comprise an interconnect via 418 and/or an interconnect wire 420. In some embodiments, the upper interconnect structure 122 may be and/or be coupled to a bit-line BL.

Within the peripheral region 404, an additional semiconductor device 422 is disposed on the substrate 102. The additional semiconductor device 422 may comprise a transistor device (e.g., a planar FET, a FinFET, a GAA device, etc.). The additional semiconductor device 422 is coupled to one or more additional lower interconnects 424. The one or more additional lower interconnects 424 are further coupled to one or more additional interconnects 426 that are laterally separated from the memory device 115.

Figure 5:
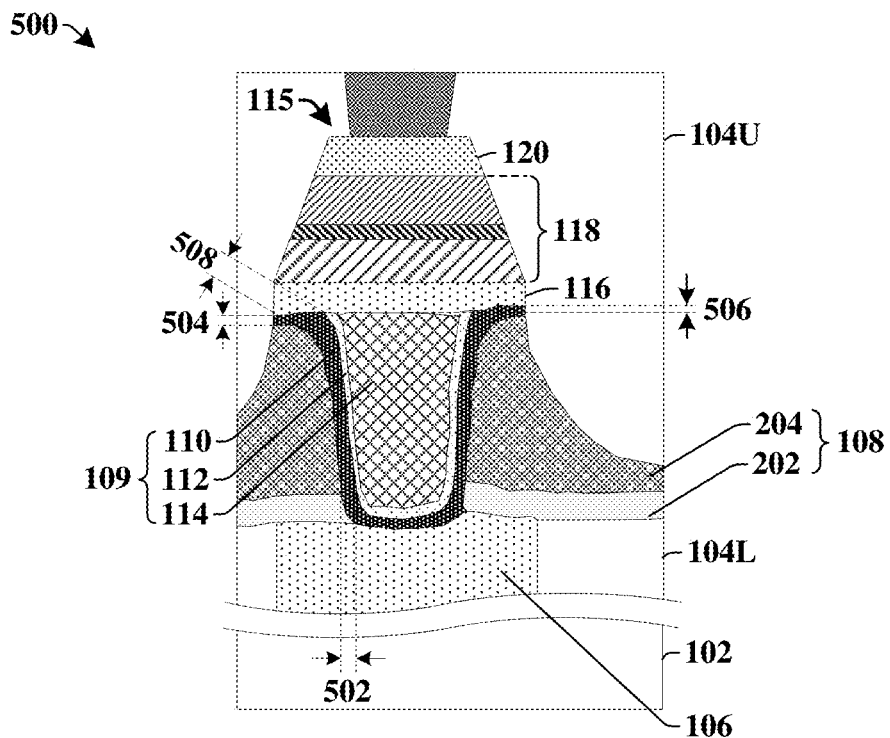
FIG. 5 illustrates a cross-sectional view of some additional embodiments of an integrated chip structure comprising an MRAM device disposed over a disclosed multi-layered bottom electrode via.

FIG. 5 illustrates a cross-sectional view of some additional embodiments of an integrated chip structure 500 comprising an MRAM device disposed over a multi-layered bottom electrode via with a relatively flat upper surface.

The integrated chip structure 500 comprises a bottom electrode via 109 disposed over one or more lower interconnects 106 within a lower dielectric structure 104L over a substrate 102. The bottom electrode via 109 couples the one or more lower interconnects 106 to a memory device 115 having a data storage structure 118 disposed between a bottom electrode 116 and a top electrode 120. The bottom electrode via 109 comprises a barrier 110, a glue layer 112 over the barrier 110, and a conductive core 114 over the glue layer 112.

In some embodiments, the barrier 110 may have a first thickness 502 along one or more interior sidewalls of the lower insulating structure 108 and a second thickness 504 directly over a topmost surface of the lower insulating structure 108. In some embodiments, the first thickness 502 may be greater than the second thickness 504. In some embodiments, the first thickness 502 may be in a range of between approximately 40% and approximately 70% larger than the second thickness 504. For example, the first thickness 502 may be in a range of between approximately 7 nm (nanometers) and approximately 10 nm, between approximately 8 nm and approximately 9 nm, approximately 8.4 nm, or other similar values, while the second thickness 504 may be in a range of between approximately 4 nm and approximately 6 nm, between approximately 5 nm and approximately 6 nm, approximately 5.4 nm, or other similar values. In some embodiments, the barrier 110 may have a third thickness 508 measured along a line that is oriented at an angle of approximately 45° with respect to a topmost surface of the barrier 110 and that is normal to a surface of the lower insulating structure 108. The third thickness 508 is greater than the first thickness 502. In some embodiments, the third thickness 508 may be a maximum thickness of the barrier 110.

In some embodiments, a top of the conductive core 114 may be recessed below a top of the barrier 110 by a first non-zero distance 506. In some embodiments, the first non-zero distance 506 may be in a range of between approximately 0.5 nm and approximately 3 nm, between approximately 1 nm and approximately 2 nm, approximately 1.9 nm, approximately 1.5 nm, approximately 1.3 nm, approximately 0.9 nm, or other similar values. In some embodiments, the conductive core 114 may have a width that changes over a height of the conductive core 114. In some embodiments, the conductive core 114 may have a maximum width at a location that is a non-zero distance below the top of the conductive core 114. In some such embodiments, fang defects may be present along outer edges of the conductive core 114. However, the fang defects will have a relatively small size (e.g., less than approximately 1 nm, less than approximately 0.5 nm, or other similar values), so as to have a minimal effect on the data storage structure 118.

Figure 6:
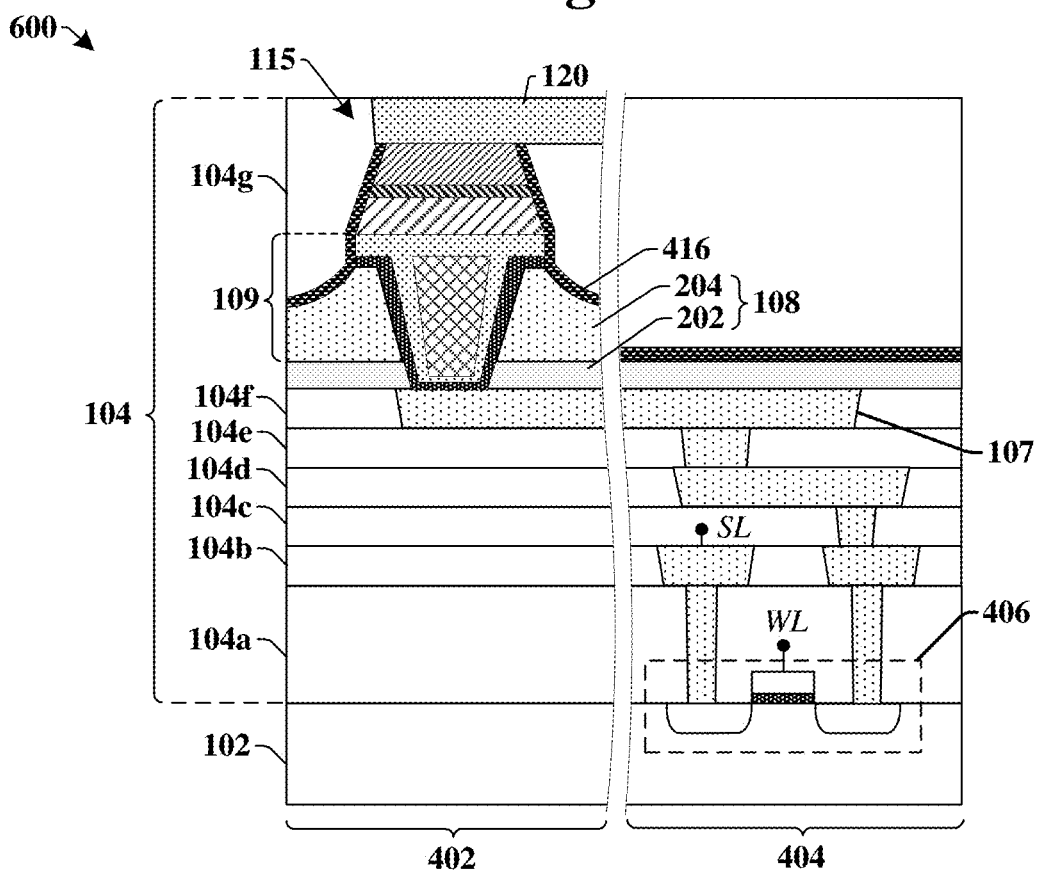
FIG. 6 illustrates a cross-sectional view of some additional embodiments of an integrated chip structure comprising an MRAM device disposed over a disclosed multi-layered bottom electrode via.

FIG. 6 illustrates a cross-sectional view of some additional embodiments of an integrated chip structure 600 comprising an MRAM device disposed over a multi-layered bottom electrode via with a relatively flat upper surface.

The integrated chip structure 600 comprises a memory device 115 disposed within a dielectric structure 104 arranged over a substrate 102. In some embodiments, the dielectric structure 104 comprises a plurality of stacked inter-level dielectric (ILD) layers 104a-104g. The plurality of stacked ILD layers 104a-104g comprise one or more lower ILD layers 104a-104f that laterally surround one or more lower interconnects 106 comprising conductive contacts, interconnect wires, and interconnect vias. In some embodiments, the plurality of stacked ILD layers 104a-104g may comprise one or more of silicon dioxide, SiCOH, a fluorosilicate glass, a phosphate glass (e.g., borophosphate silicate glass), or the like. In some embodiments, the one or more lower interconnects 106 may comprise a conductive metal such as copper, aluminum, and/or tungsten, for example. In some embodiments, two or more adjacent ones of the plurality of stacked ILD layers 104a-104g may be separated by an etch stop layer (not shown) comprising a nitride, a carbide, or the like.

A lower insulating structure 108 is over the one or more lower ILD layers 104a-104f. The lower insulating structure 108 comprises one or more interior sidewalls that form an opening extending through the lower insulating structure 108. In various embodiments, the lower insulating structure 108 may comprise a first lower insulating layer 202 and a second lower insulating layer 204 over the first lower insulating layer 202. A bottom electrode via 109 is arranged between the one or more interior sidewalls of the lower insulating structure 108. The bottom electrode via 109 couples the one or more lower interconnects 106 to a memory device 115. In some embodiments, the memory device 115 comprises a bottom electrode 116 that is separated from a top electrode 120 by way of a data storage structure 118. In some embodiments, the top electrode 120 may laterally extend past one or more sides of the data storage structure 118. In some such embodiments, the top electrode 120 may serve as a bit-line or may be electrically coupled to a bit-line. In some embodiments, the top electrode 120 may be disposed over an upper surface of ILD layer 104g and/or a protective layer 416.

In some embodiments, the one or more lower interconnects 106 may comprise an interconnect wire 107 that laterally extends from directly below the memory device 115 to laterally outside of the memory device 115. In some such embodiments, the interconnect wire 107 may couple the memory device 115 to an access device 406 that is also laterally outside of the memory device 115. In some embodiments, the access device 406 may be disposed within a peripheral region 404 that is laterally outside of the embedded memory region 402.

FIGS. 7-19 illustrate cross-sectional views 700-1900 showing some embodiments of a method of forming an integrated chip structure comprising a memory device disposed over a multi-layered bottom electrode via with a relatively flat upper surface. Although FIGS. 7-19 are described in relation to a method, it will be appreciated that the structures disclosed in FIGS. 7-19 are not limited to such a method, but instead may stand alone as structures independent of the method.

Figure 7:
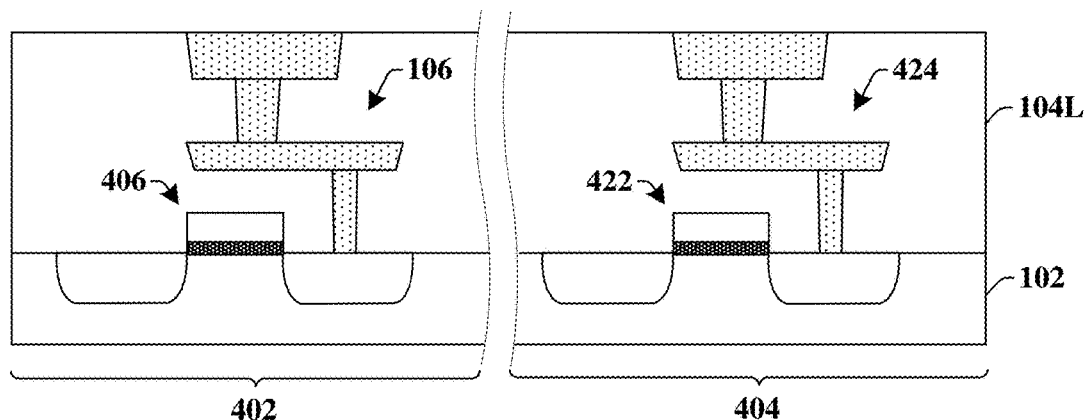
FIGS. 7-19 illustrate cross-sectional views showing some embodiments of a method of forming an integrated chip structure comprising a memory device disposed over a multi-layered bottom electrode via with a relatively flat upper surface.

As shown in cross-sectional view 700 of FIG. 7, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 102 comprises an embedded memory region 402 and a peripheral region 404 (e.g., a logic region, a chip boundary region, etc.).

In some embodiments, an access device 406 is formed on the substrate 102 within the embedded memory region 402. In some embodiments, the access device 406 may comprise a transistor (e.g., a planar FET, a FinFET, a GAA transistor, a nanosheet transistor, or the like). In some embodiments, the access device 406 may be formed by depositing a gate dielectric film and a gate electrode film over the substrate 102. The gate dielectric film and the gate electrode film are subsequently patterned to form a gate dielectric and a gate electrode. The substrate 102 may be subsequently implanted to form a source region and a drain region within the substrate 102 on opposing sides of the gate electrode. In some embodiments, an additional semiconductor device 422 may be formed on the substrate 102 within the peripheral region 404.

In some embodiments, one or more lower interconnects 106 may be formed within a lower dielectric structure 104L formed over the embedded memory region 402 of the substrate 102. In some embodiments, the lower dielectric structure 104L may comprise one or more stacked ILD layers. In some embodiments, the one or more lower interconnects 106 may comprise one or more of a conductive contact, an interconnect wire, and an interconnect via. The one or one or more lower interconnects 106 may be formed by forming an ILD layer of the one or more lower ILD layers (e.g., an oxide, a low-k dielectric, or an ultra low-k dielectric) over the substrate 102, selectively etching the ILD layer to form a via hole and/or a trench within the ILD layer, forming a conductive material (e.g., copper, aluminum, etc.) within the via hole and/or the trench, and performing a planarization process (e.g., a chemical mechanical planarization process) to remove excess of the conductive material from over the ILD layer. In some embodiments, one or more additional lower interconnects 424 may be formed within the lower dielectric structure 104L over the peripheral region 404 of the substrate 102.

Figure 8:
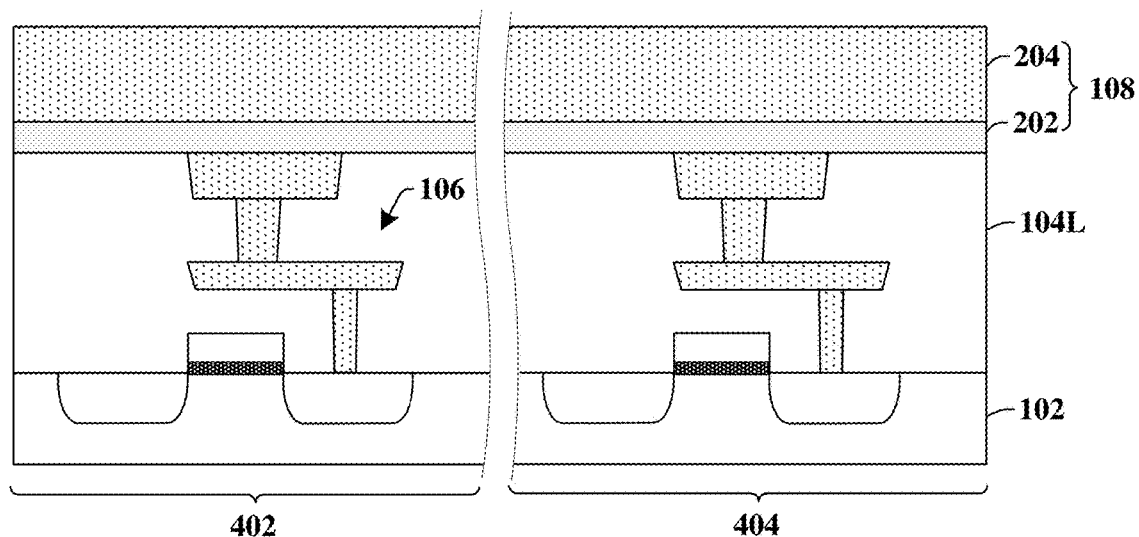

As shown in cross-sectional view 800 of FIG. 8, a lower insulating structure 108 is formed over the lower dielectric structure 104L. In some embodiments, the lower insulating structure 108 comprises a plurality of different stacked dielectric materials. For example, in some embodiments, the lower insulating structure 108 comprises a first lower insulating layer 202 and a second lower insulating layer 204 over the first lower insulating layer 202. In some embodiments, the first lower insulating layer 202 may comprise silicon rich oxide, silicon carbide, silicon nitride, or the like. In some embodiments, the second lower insulating layer 204 may comprise silicon carbide, silicon nitride, or the like. In some embodiments, the lower insulating structure 108 may be formed by one or more deposition processes (e.g., a PVD process, a CVD process, a PE-CVD process, a high-density ionized metal plasma (IMP) deposition, a high-density inductively coupled plasma (ICP) deposition, a sputtering process, a low-pressure chemical vapor deposition (LP-CVD), or the like).

Figure 9:
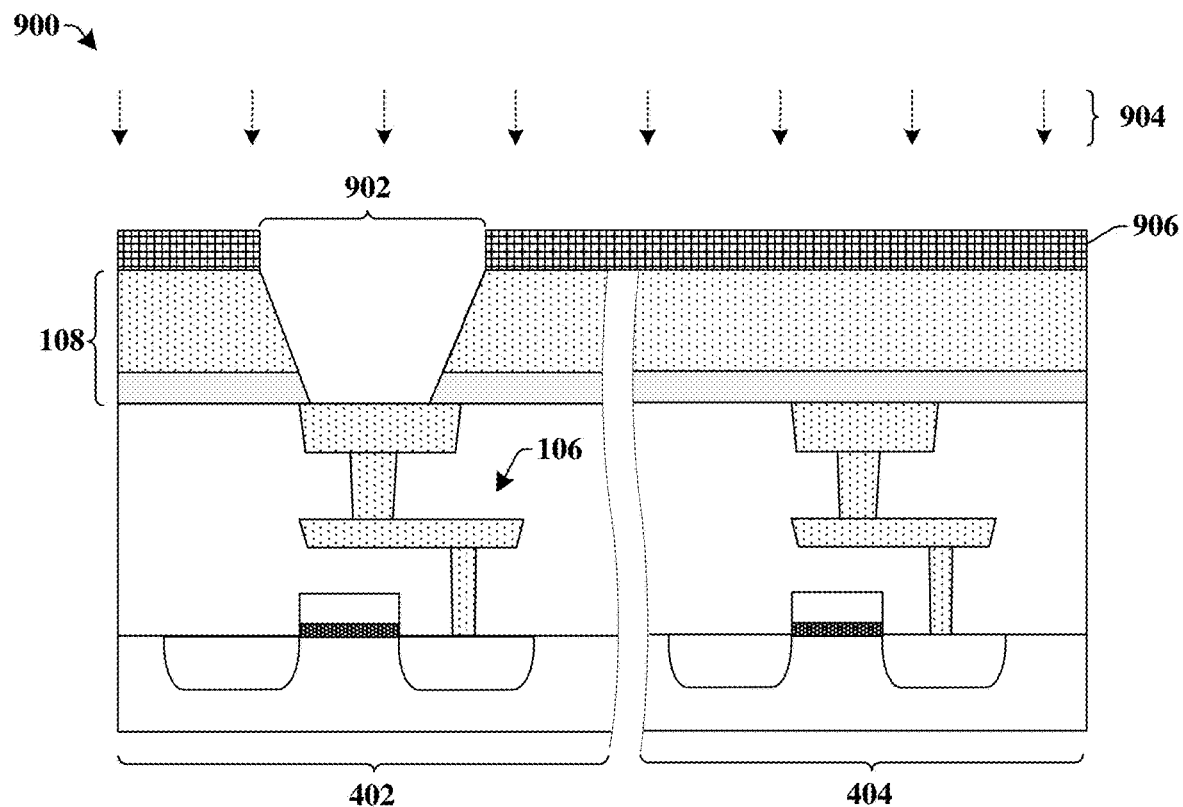

As shown in cross-sectional view 900 of FIG. 9, the lower insulating structure 108 is patterned to form a bottom electrode via opening 902 that extends through the lower insulating structure 108 to expose the one or more lower interconnects 106. In some embodiments, the bottom electrode via opening 902 may be formed according to a first patterning process. In some embodiments, the first patterning process may be performed by selectively exposing the lower insulating structure 108 to a first etchant 904 according to a first mask 906. The first patterning process forms the bottom electrode via opening 902 defined by one or more interior sidewalls of the lower insulating structure 108. In some embodiments, the first etchant 904 may comprise a plasma etchant having a fluorine based etching chemistry (e.g., a $SF_6$ plasma, or the like). In some embodiments, the first mask 906 may comprise a photoresist, a hard mask, or the like.

Figure 10:
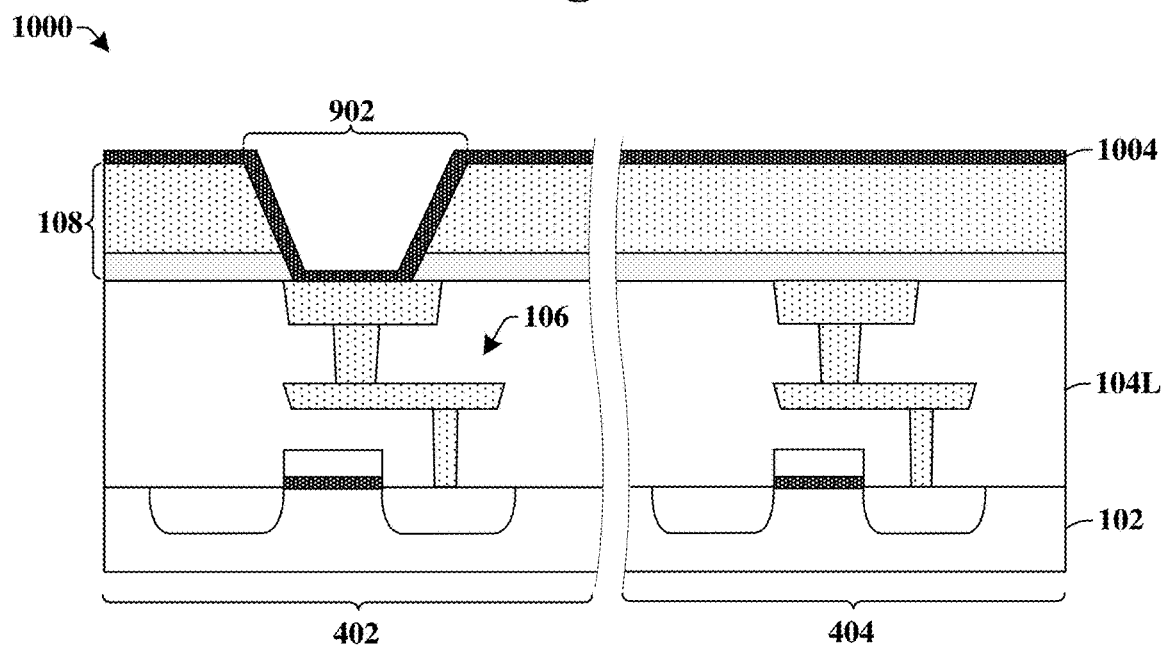

As shown in cross-sectional view 1000 of FIG. 10, a barrier layer 1004 is formed within the bottom electrode via opening 902 and over the lower insulating structure 108. In some embodiments, the barrier layer 1004 may comprise a metal-nitride, such as titanium nitride, tantalum nitride, or the like. In various embodiments, the barrier layer 1004 may be formed to a thickness that is in a range of between approximately 50 Å and approximately 100 Å, between approximately 75 Å and approximately 85 Å, approximately 80 Å, or other similar values. In some embodiments, the barrier layer 1004 may be formed by a deposition process (e.g., a PVD process, a CVD process, a PE-CVD process, a high-density IMP deposition, a high-density ICP deposition, a sputtering process, a LP-CVD process, or the like).

Figure 11:
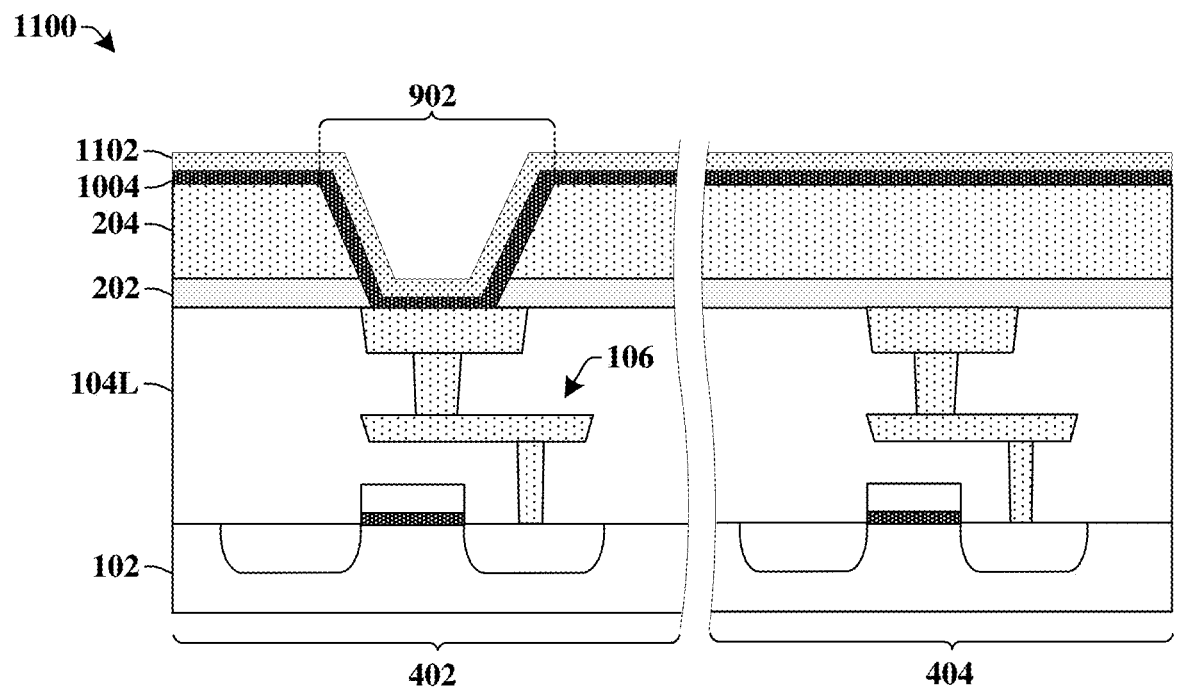

As shown in cross-sectional view 1100 of FIG. 11, an intermediate glue layer 1102 is formed within the bottom electrode via opening 902 and over the barrier layer 1004. In some embodiments, the intermediate glue layer 1102 may comprise a metal nitride such as titanium nitride, tantalum nitride, or the like. In some embodiments, the intermediate glue layer 1102 may be formed to a thickness that is in a range of between approximately 50 Å and approximately 100 Å, between approximately 50 Å and approximately 75 Å, approximately 60 Å, or other similar values. In some embodiments, the intermediate glue layer 1102 may be formed by a deposition process (e.g., a PVD process, a CVD process, a PE-CVD process, a high-density IMP deposition, a high-density ICP deposition, a sputtering process, a LP-CVD process, or the like).

Figure 12:
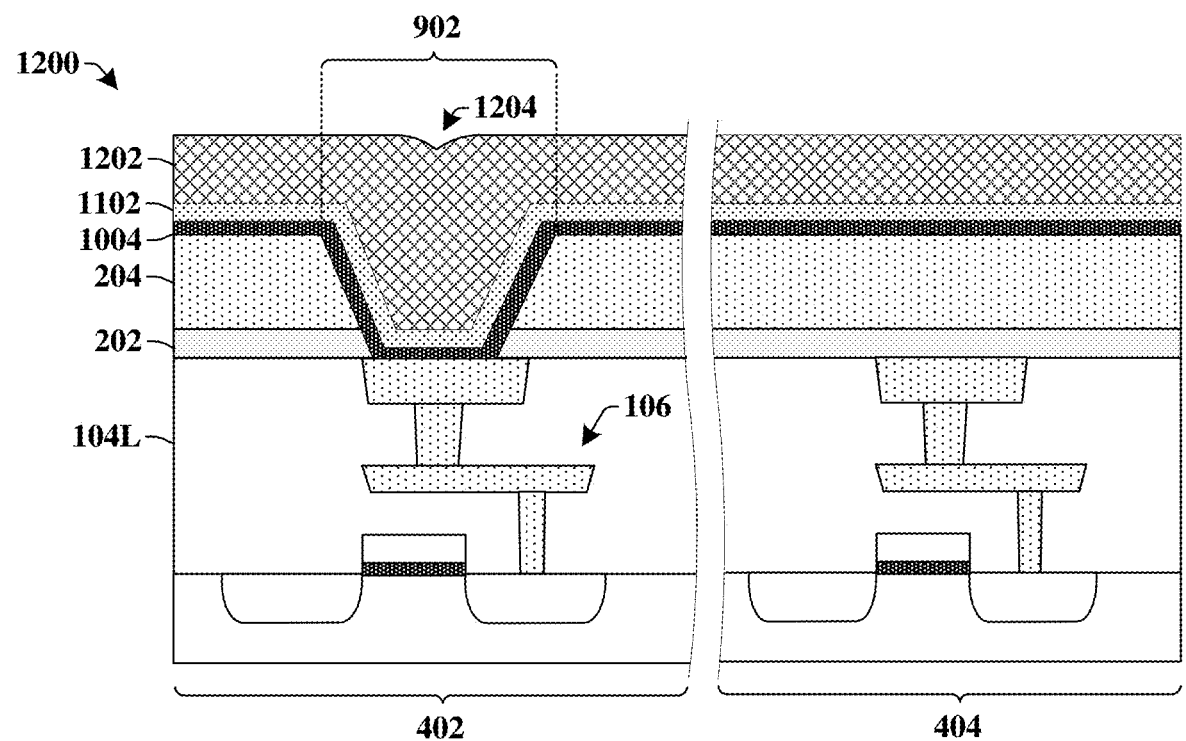

As shown in cross-sectional view 1200 of FIG. 12, a conductive core material 1202 is formed within the bottom electrode via opening 902 and over the intermediate glue layer 1102. In some embodiments, the conductive core material 1202 may comprise and/or be tungsten. In some embodiments, the conductive core material 1202 may be formed to a thickness that is in a range of between approximately 500 Å and approximately 1500 Å, between approximately 750 Å and approximately 1000 Å, approximately 1000 Å, or other similar values. In some embodiments, the conductive core material 1202 may comprise surfaces defining a recess 1204 arranged along an upper surface of the conductive core material 1202. In some embodiments, the conductive core material 1202 may be formed by a deposition process (e.g., a PVD process, a CVD process, a PE-CVD process, a high-density IMP deposition, a high-density ICP deposition, a sputtering process, a LP-CVD process, or the like) and/or a plating process (e.g., electroplating, electro-less plating, etc.).

Figure 13:
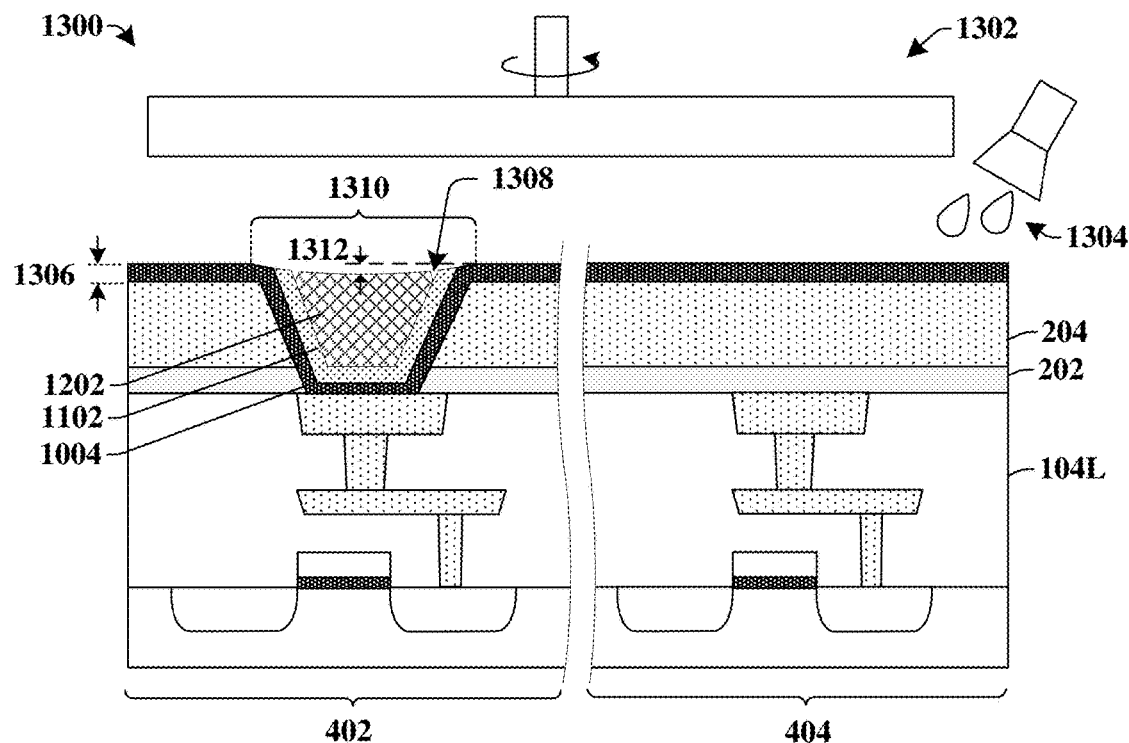

As shown in cross-sectional view 1300 of FIG. 13, a mechanical polishing process 1302 is performed on the conductive core material 1202. The mechanical polishing process 1302 removes part of the conductive core material 1202 so as to expose upper surfaces of the barrier layer 1004, the intermediate glue layer 1102, and the lower insulating structure 108. In some embodiments, the mechanical polishing process 1302 may also remove parts of the barrier layer 1004, the intermediate glue layer 1102, and/or the lower insulating structure 108. In some embodiments, mechanical polishing process 1302 may utilize a first slurry 1304 that comprises an oxidizer. In some embodiments, the oxidizer may comprise hydrogen peroxide ($H_2O_2$), Ferric nitrate ($Fe(NO_3)_3$), or other similar oxidizers.

In some embodiments, the first slurry 1304 may comprise a first pH value. The first pH value may be in a range of between approximately 2 and approximately 9, between approximately 2 and approximately 3, approximately 2.2, or other similar values. The first slurry 1304 may be configured to enable the mechanical polishing process 1302 to have a first removal rate for the conductive core material 1202, a second removal rate for the barrier layer 1004, and a third removal rate for the lower insulating structure 108. In some embodiments, the first removal rate is much greater than the second removal rate, and the second removal rate is much greater than the third removal rate. For example, the first removal rate may be approximately 1,595 Å/min, the second removal rate may be approximately 95 Å/min, and the third removal rate may be approximately 13 Å/min. The relatively high first removal rate allows for the mechanical polishing process 1302 to quickly remove the conductive core material 1202, thereby providing for a high throughput.

After completion of the mechanical polishing process 1302, the barrier layer 1004 may comprise a first thickness 1306 directly over a topmost surface of the lower insulating structure 108. In various embodiments, the first thickness 1306 may be in a range of between approximately 8 nm and approximately 10 nm, between approximately 8 nm and approximately 10 nm, approximately 9 nm, approximately 8.4 nm, or other similar values. In some embodiments, after completion of the mechanical polishing process 1302, the conductive core material 1202 may comprise one or more fang defects 1308 along outer edges of the conductive core material 1202. The one or more fang defects 1308 comprise recessed areas (e.g., one or more divots) along the outer edges of the conductive core material 1202. In some embodiments, the one or more fang defects 1308 may extend to depths that are in a range of between approximately 25 Å and approximately 75 Å, between approximately 40 Å and approximately 60 Å, or other similar values. In some embodiments, after completion of the mechanical polishing process a dished region 1310 may also be present. The dished region 1310 comprises a region of the barrier layer 1004, the intermediate glue layer 1102, and/or the conductive core material 1202 that are recessed below a top of the barrier layer 1004. In some embodiments, the dished region 1310 may have a first maximum depth 1312 that is in a range of between approximately 4 nm and approximately 5 nm, approximately 5 nm, approximately 4.7 nm, approximately 4.5 nm, approximately 4.2 nm, or other similar values.

Figure 14:
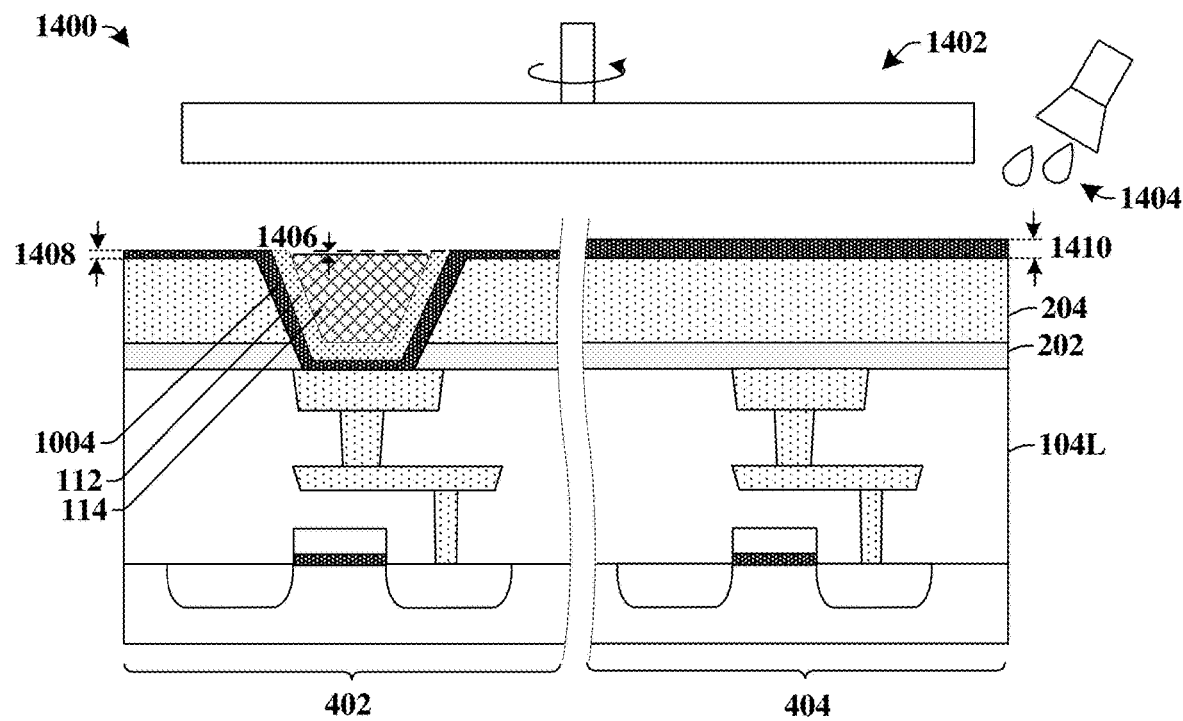

As shown in cross-sectional view 1400 of FIG. 14, a buffing process 1402 is performed on the barrier layer 1004, the glue layer (e.g., 1102 of FIG. 13), and conductive core material (e.g., 1202 of FIG. 13) to form a conductive core 114 on a glue layer 112. In some embodiments, the buffing process 1402 may utilize a second slurry 1404 that is devoid of an oxidizer (e.g., that does not contain an oxidizer). Using a second slurry 1404 that is devoid of an oxidizer reduces galvanic corrosion between the conductive core 114 and the glue layer 112, thereby minimizing a size of the one or more fang defects along outer edges of the conductive core 114. By minimizing the size of the one or more fang defects along outer edges of the conductive core 114, the buffing process 1402 is able to form a more planar upper interface extending along topmost surfaces of the conductive core 114, the glue layer 112, and the barrier layer 1004. By using the buffing process to form a more planar upper interface, overlying layers will be more planar thereby improving a performance of an overlying data storage structure (e.g., an overlying MTJ).

The buffing process 1402 may also reduce a depth of the dishing region from a first maximum depth (e.g., 1312 of FIG. 14) to a second maximum depth 1406. In some embodiments, the second maximum depth 1406 is in a range of between approximately 0.5 nm and approximately 2 nm, less than 2 nm, approximately 1.9 nm, approximately 1.5 nm, approximately 1.3 nm, approximately 0.9 nm, or other similar values. In some embodiments, the buffing process 1402 may reduce a depth of the dished region by approximately 40% to approximately 50%. For example, the buffing process 1402 may reduce a maximum depth of the dished region from a first maximum depth (e.g., 1312 of FIG. 13) of approximately 4.7 nm to a second maximum depth 1406 of approximately 1.9 nm.

In some embodiments, the buffing process 1402 may also reduce a thickness of a part of the barrier layer 1004 within the embedded memory region 402. For example, the buffing process 1402 may reduce a thickness of the barrier layer 1004 directly over the topmost surface of the lower insulating structure 108 from the first thickness (e.g., 1308 of FIG. 13) to a second thickness 1408 that is less than the first thickness. In some embodiments, the buffing process 1402 may reduce the thickness of the barrier layer 1004 directly over the topmost surface of the lower insulating structure 108 by approximately 30% to approximately 40%. For example, in some embodiments, the buffing process 1402 may reduce the thickness of the barrier layer 1004 from a first thickness of approximately 8.4 nm to a second thickness 1408 of approximately 5.4 nm. Reducing the thickness of the barrier layer 1004 directly over the topmost surface of the lower insulating structure 108 may cause the barrier layer 1004 to have a greater thickness along the one or more interior sidewalls of the lower insulating structure 108 than directly over the topmost surface of the lower insulating structure 108.

In some embodiments, the buffing process 1402 may cause the barrier layer 1004 to have different thicknesses in different regions of a substrate 102. For example, the barrier layer 1004 may have the second thickness 1408 within the embedded memory region 402 and a third thickness 1410 within the peripheral region 404. In some embodiments, the second thickness may be less than the third thickness 1410. For example, the second thickness 1408 may be approximately 30 Å, while the third thickness 1410 may be approximately 70 Å. In some embodiments, the difference in thicknesses between the second thickness 1408 and the third thickness 1410 may be due to a loading effect of the buffing process 1402 caused by a high density of bottom electrode vias within a memory array of the embedded memory region 402. The loading effect causes cause the barrier layer 1004 to be removed at a faster rate in the embedded memory region 402 than in the peripheral region 404.

In some embodiments, the second slurry 1404 may comprise a second pH value. The second pH value may be greater than the first pH value. In various embodiments, the second pH value may be in a range of between approximately 4 and approximately 8, between approximately 5 and approximately 7, approximately 6, or other similar values. The second slurry 1404 may be configured to have a first removal rate for the conductive core material, a second removal rate for the barrier layer, and a third removal rate for the lower insulating structure. In some embodiments, the first removal rate is approximately equal to the second removal rate and less than the third removal rate. In some embodiments, the first removal rate is between approximately 0 Å/min and approximately 5 Å/min, the second removal rate is between approximately 0 Å/min and approximately 5 Å/min, and the third removal rate is approximately 3,350 Å/min. In some embodiment, the buffing process 1402 may be performed for a time that is in a range of between approximately 200 seconds and approximately 300 seconds, between approximately 225 seconds and approximately 250 seconds, approximately 240 seconds, or other similar values.

In some embodiments, the second slurry 1404 may comprise a water soluble polymer, ceric hydroxide ($Ce(OH)_4$), imidazole ($C_3H_4N_2$), acetic acid ($C_2H_4O_2$), and/or purified water. The water soluble polymer may have a content that is between approximately 0.5% and approximately 10% of the second slurry weight. The ceric hydroxide may have a content that is between approximately 0.1% and approximately 1.0% of the second slurry weight. The imidazole may have a content that is less than approximately 1% of the second slurry weight. The acetic acid may have a content that is less than approximately 1% of the second slurry weight. The purified water may have a content that is between approximately 89.9% and approximately 99.4% of the second slurry weight.

Figure 15:
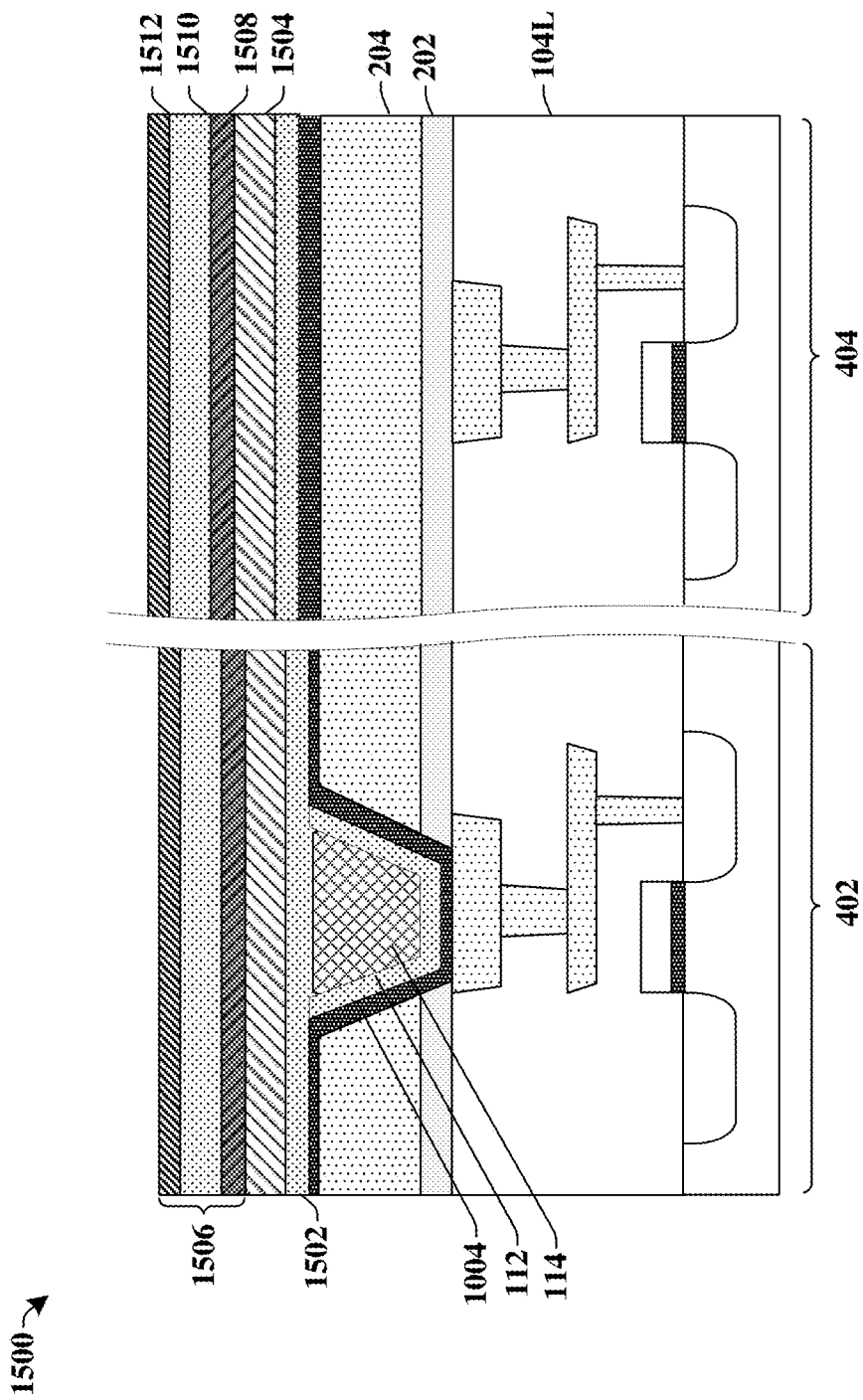

As shown in cross-sectional view 1500 of FIG. 15, a bottom electrode layer 1502 is formed over the barrier layer 1004, the glue layer 112, and the conductive core 114. The bottom electrode layer 1502 may be formed to contact the conductive core 114. In various embodiments, the bottom electrode layer 1502 may comprise a metal (e.g., tantalum), a metal nitride (e.g., tantalum nitride), or the like. In some embodiments, the bottom electrode layer 1502 may be formed by one or more deposition processes (e.g., a PVD process, a CVD process, a PE-CVD process, a high-density IMP deposition, a high-density ICP deposition, a sputtering process, a LP-CVD process, and/or the like).

A data storage layer 1504 is formed over the bottom electrode layer 1502. The data storage layer 1504 may be formed to contact the bottom electrode layer 1502. In various embodiments, the data storage layer 1504 may comprise a magnetic tunnel junction (MTJ) structure. In some embodiments, the data storage layer 1504 may be formed by one or more deposition processes (e.g., a PVD process, a CVD process, a PE-CVD process, a high-density IMP deposition, a high-density ICP deposition, a sputtering process, a LP-CVD process, and/or the like).

A top electrode structure 1506 is formed over the data storage layer 1504. The top electrode structure 1506 may be formed to contact the data storage layer 1504. In various embodiments, the top electrode structure 1506 may comprise a metal (e.g., titanium), a metal nitride (e.g., titanium nitride), or the like. In some embodiments, the top electrode structure 1506 may comprise a multi-layer structure. For example, the top electrode layer may comprise a first top electrode layer 1508, a second top electrode layer 1510, and a third top electrode layer 1512. The first top electrode layer 1508 may comprise a first metal (e.g., ruthenium), the second top electrode layer 1510 may comprise a second metal (e.g., tungsten), and the third top electrode layer 1512 may comprise a third metal (e.g., tantalum). In some embodiments, the top electrode structure 1506 may be formed by one or more deposition processes (e.g., a PVD process, a CVD process, a PE-CVD process, a high-density IMP deposition, a high-density ICP deposition, a sputtering process, a LP-CVD process, and/or the like).

Figure 16:
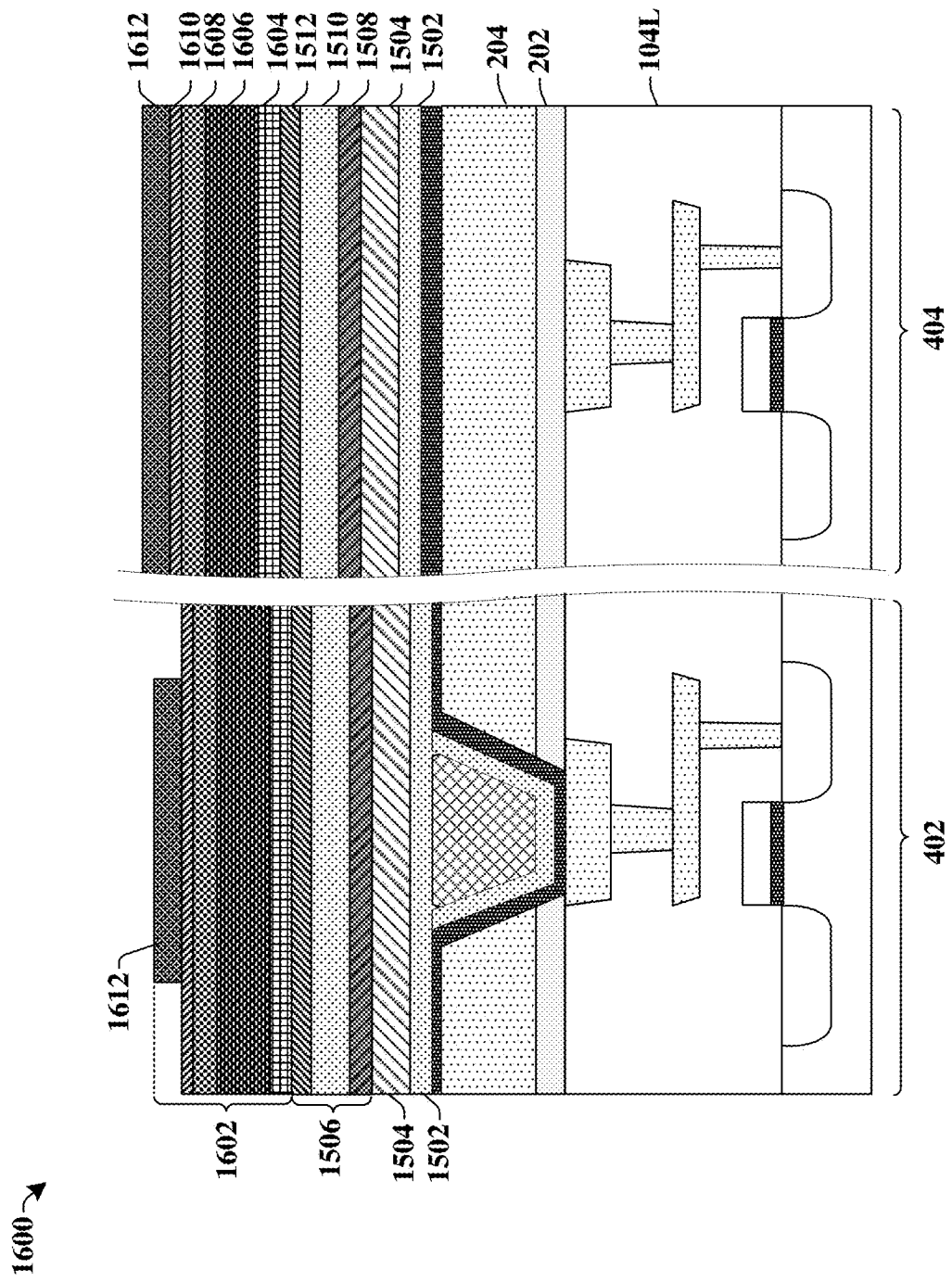

As shown in cross-sectional view 1600 of FIG. 16, a second mask 1602 is formed over the top electrode structure 1506. In some embodiments, the second mask 1602 may comprise a multi-layer structure. For example, the second mask 1602 may comprise a first oxide 1604 (e.g., a silicon rich oxide, silicon oxy-nitride, or the like), an advanced patterning film (APF) 1606, and a second oxide 1608 (e.g., a silicon rich oxide, silicon oxy-nitride, or the like). In some additional embodiments, the second mask 1602 may further comprise an antireflective coating 1610 on the second oxide 1608 and a photoresist material 1612 on the antireflective coating 1610. In various embodiments, the first oxide 1604, the APF 1606, and the second oxide 1608 may be formed by deposition processes (e.g., a PVD process, a CVD process, a PE-CVD process, a high-density IMP deposition, a high-density ICP deposition, a sputtering process, a LP-CVD process, and/or the like).

Figure 17:
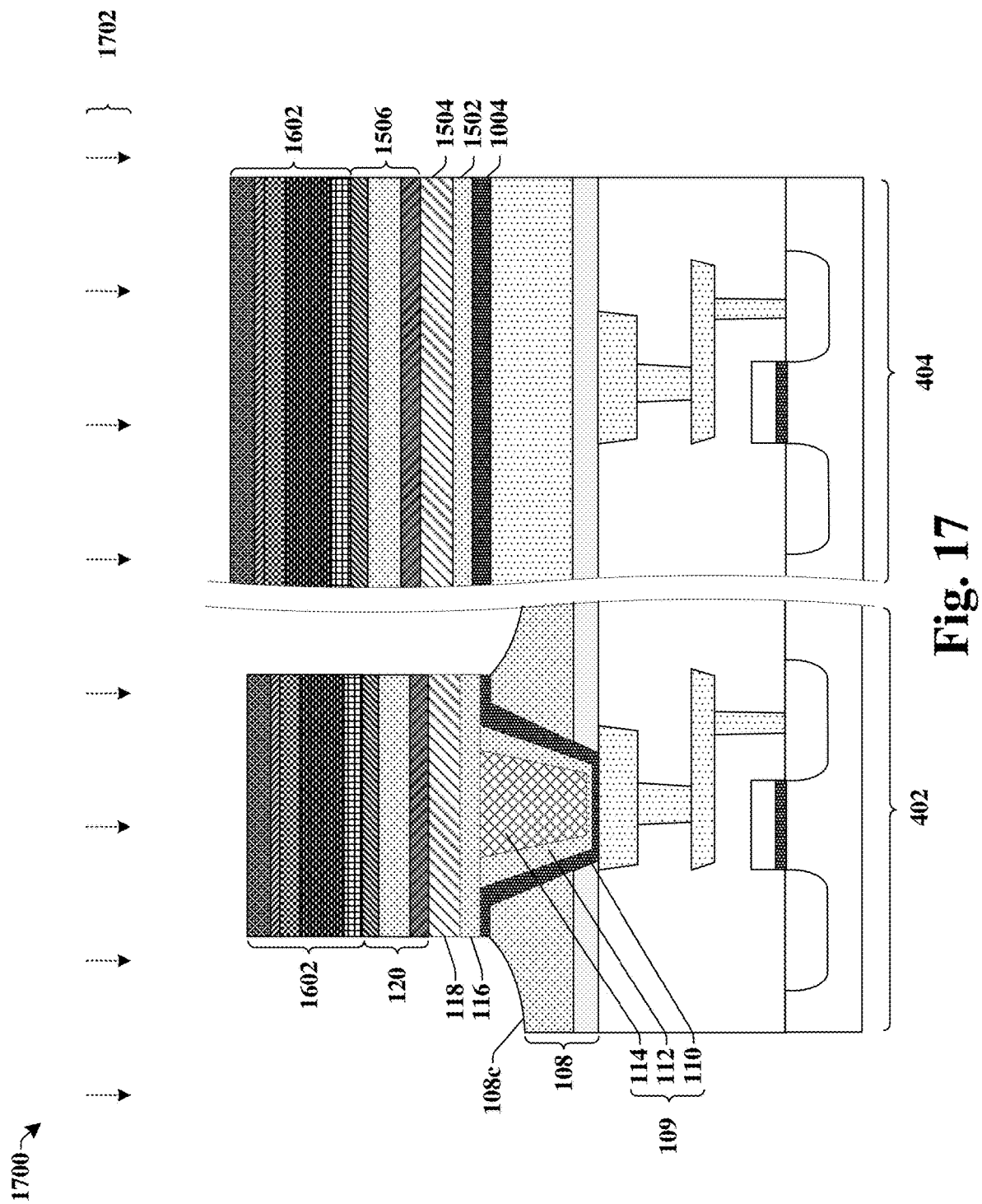

As shown in cross-sectional view 1700 of FIG. 17, a second patterning process is performed. The second patterning process etches the top electrode structure (1506 of FIG. 16), the data storage layer (e.g., 1504 of FIG. 16), and the bottom electrode layer (e.g., 1502 of FIG. 16) to form a memory device 115 having a data storage structure 118 disposed between a bottom electrode 116 and a top electrode 120. In some additional embodiments, the second patterning process also etches the barrier layer (e.g., 1004 of FIG. 14) to form a bottom electrode via 109 having a barrier 110 separated from the conductive core 114 by the glue layer 112. In some additional embodiments, the second patterning process also etches the lower insulating structure 108 to form curved outer sidewalls 108c of the lower insulating structure 108. In some embodiments, the second patterning process selectively exposes the top electrode structure, the data storage layer, and the bottom electrode layer to a second etchant 1702 according to the second mask 1602. In some embodiments, the second patterning process may comprise a focused ion beam etching (FIBE) process. In other embodiments, the second patterning process may be a reactive ion etching process, an ion beam etching process, a sputter etching process, or the like.

Figure 18:
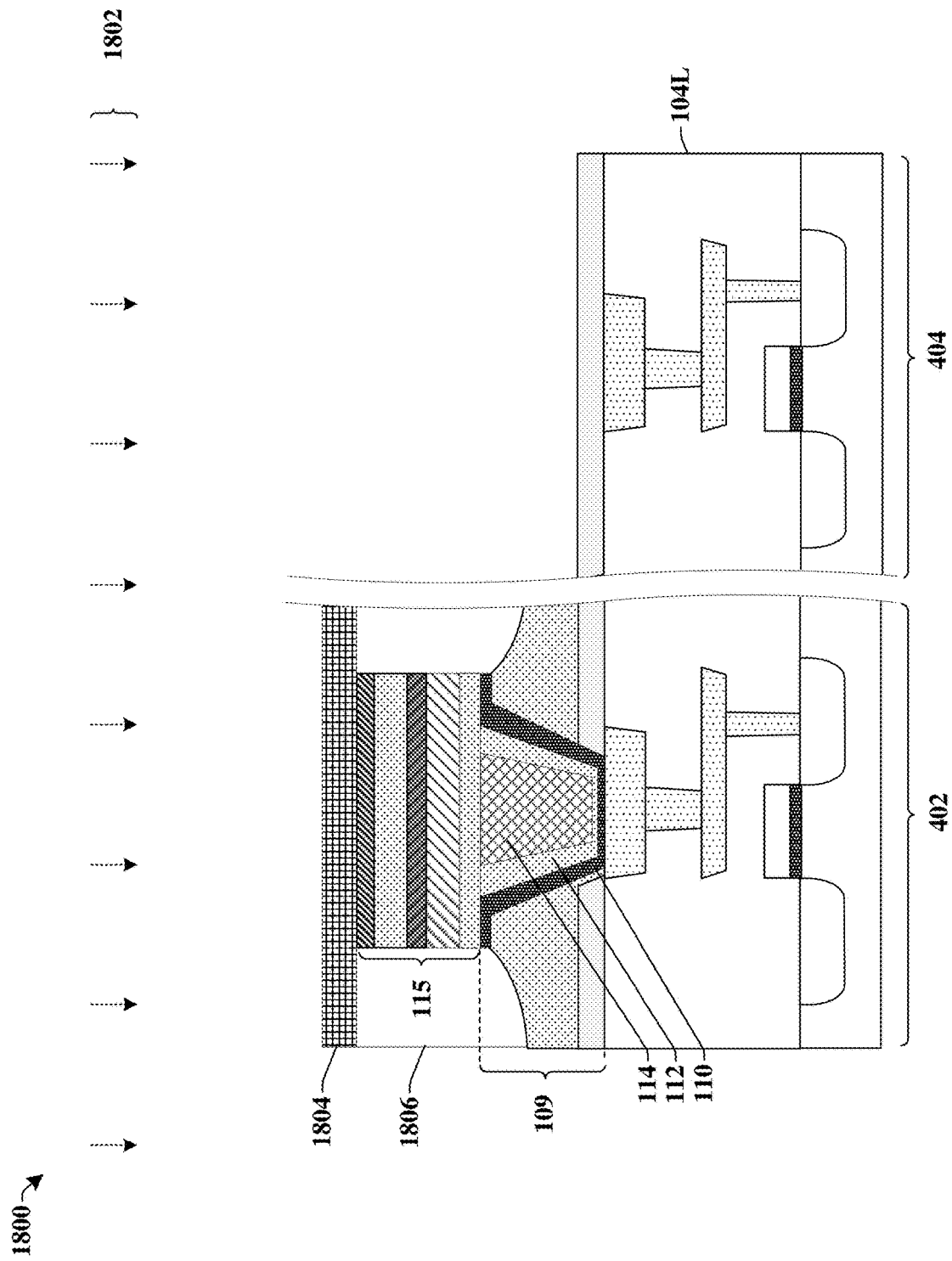

As shown in cross-sectional view 1800 of FIG. 18, a third patterning process is performed. The third patterning process removes the second mask (e.g., 1602 of FIG. 17), the top electrode structure (e.g., 1506 of FIG. 17), the data storage layer (e.g., 1504 of FIG. 17), and the bottom electrode layer (e.g., 1502 of FIG. 17) within the peripheral region 404. In some embodiments, the third patterning process may further remove the barrier layer (e.g., 1004 of FIG. 17) and a part of the lower insulating structure 108 (e.g., the second lower insulating layer 204) within the peripheral region 404. In some embodiments, the third patterning process may be performed by exposing the peripheral region 404 to one or more etchants 1802 with a third mask 1804 in place over the embedded memory region 402. In some embodiments, an embedded memory region ILD layer 1806 is formed within the embedded memory region 402 prior to forming the third mask 1804.

Figure 19:
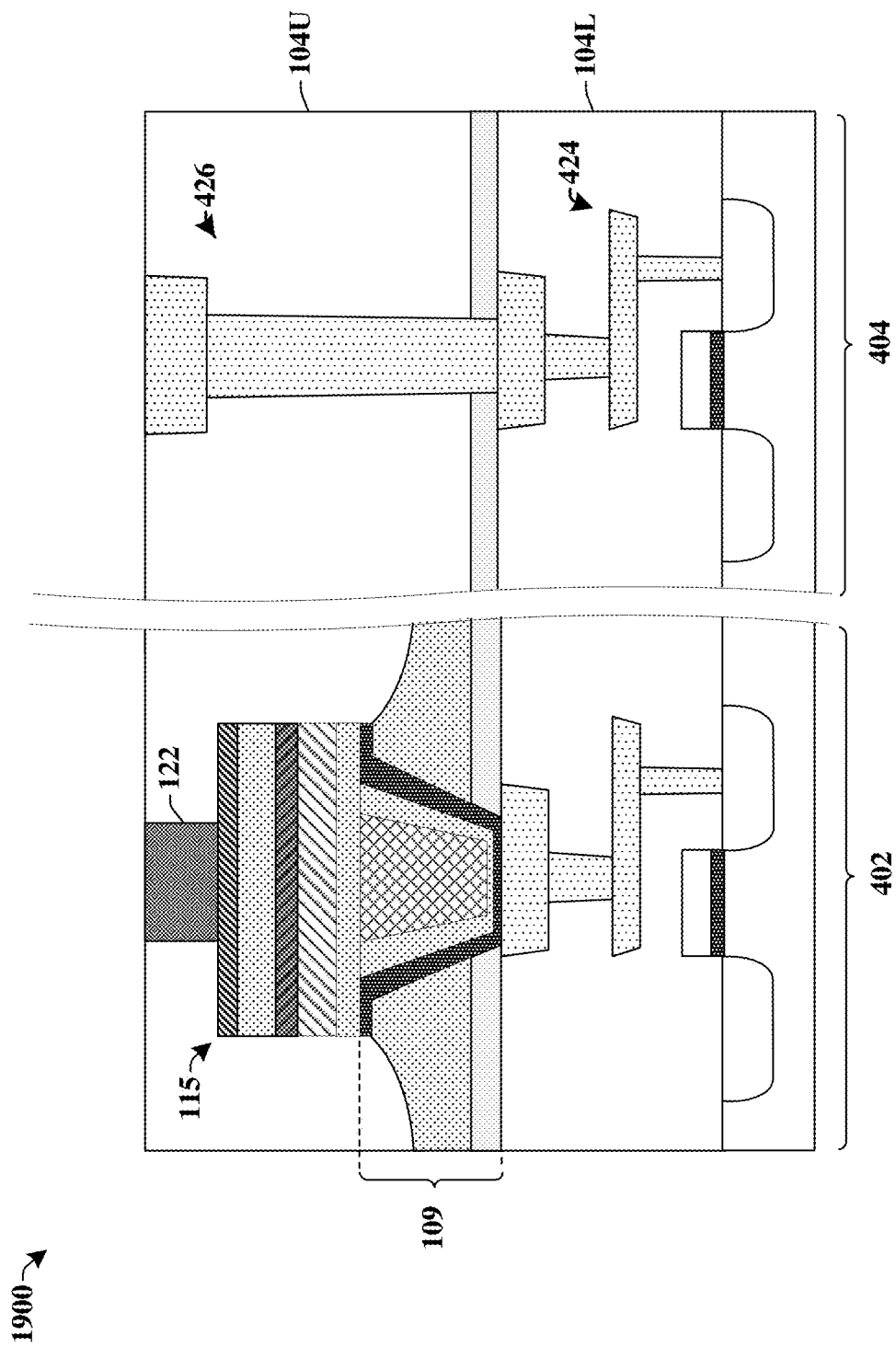

As shown in cross-sectional view 1900 of FIG. 19, an upper dielectric structure 104U is formed over the memory device 115. In some embodiments, the upper dielectric structure 104U may be formed by a deposition process (e.g., a PVD process, a CVD process, a PE-CVD process, a high-density IMP deposition, a high-density ICP deposition, a sputtering process, a LP-CVD process, or the like). In various embodiments, the upper dielectric structure 104U may comprise silicon dioxide, carbon doped silicon dioxide, silicon oxynitride, BSG, PSG, BPSG, FSG, a porous dielectric material (e.g., porous carbon doped silicon dioxide), or the like.

An upper interconnect structure 122 is formed in the upper dielectric structure 104U within the embedded memory region 402, and one or more additional interconnects 426 are formed in the upper dielectric structure 104U within the peripheral region 404. In some embodiments, the upper interconnect structure 122 may comprise an interconnect via and/or an interconnect wire. In some embodiments, the one or more additional interconnects 426 may comprise an interconnect via and an interconnect wire. The upper interconnect structure 122 and the one or more additional interconnects 426 may be concurrently formed by selectively etching the upper dielectric structure 104U to form via holes and/or trenches within the upper dielectric structure 104U, forming a conductive material (e.g., copper, aluminum, etc.) within the via holes and/or trenches, and performing a planarization process (e.g., a chemical mechanical planarization process). In some embodiments, the planarization process may comprise a chemical mechanical planarization (CMP) process.

Figure 20:
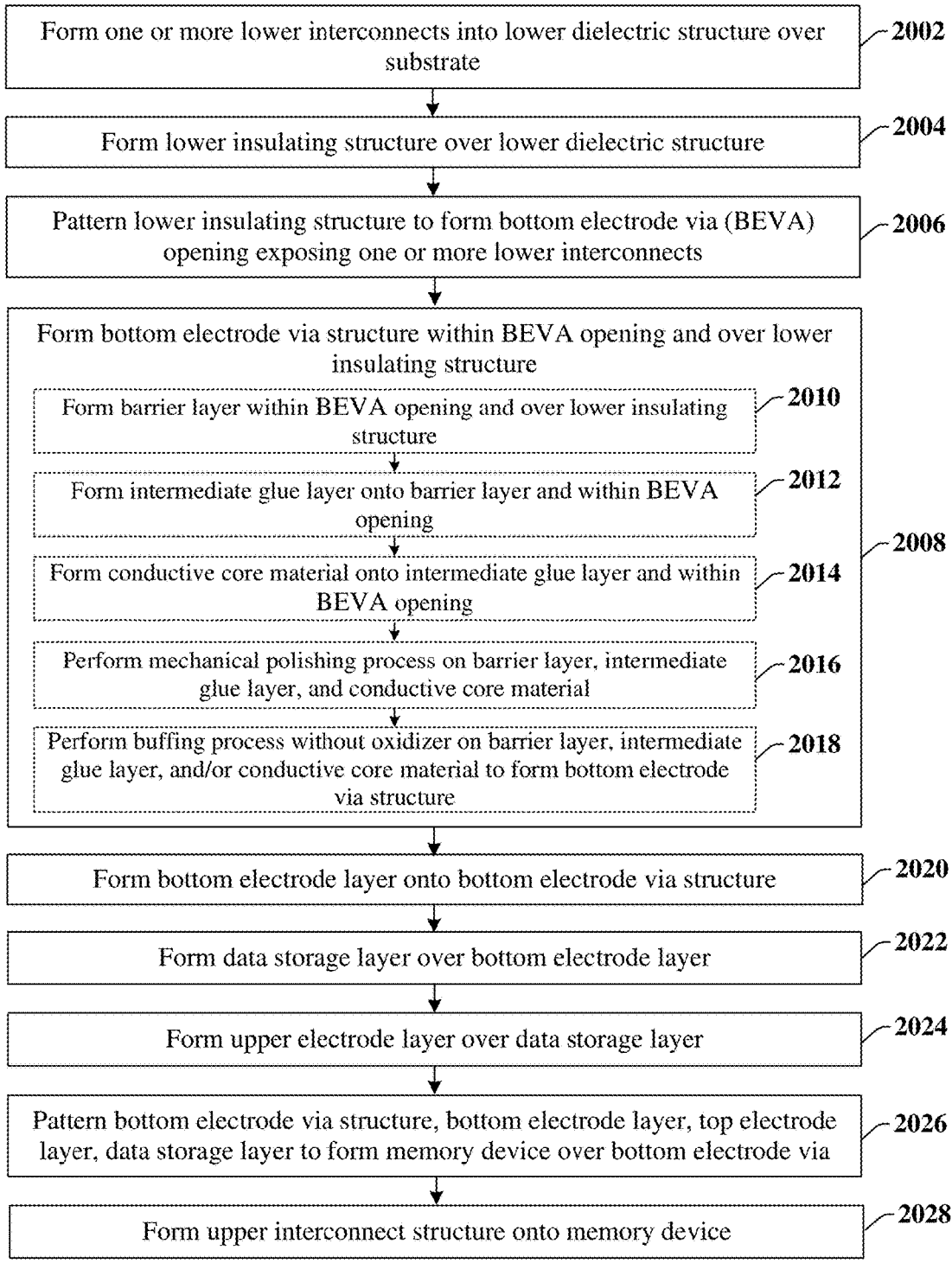
FIG. 20 illustrates a flow diagram of some embodiments of a method of forming an integrated chip structure comprising a memory device disposed over a multi-layered bottom electrode via with a relatively flat upper surface.

FIG. 20 illustrates a flow diagram of some embodiments of a method 2000 of forming an integrated chip structure comprising a memory device disposed over a multi-layered bottom electrode via with a relatively flat upper surface.

While method 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, one or more lower interconnects are formed within a lower dielectric structure formed over a substrate. FIG. 7 illustrates a cross-sectional view 700 of some embodiments corresponding to act 2002.

At act 2004, a lower insulating structure is formed over the lower dielectric structure. FIG. 8 illustrates a cross-sectional view 800 of some embodiments corresponding to act 2004.

At act 2006, the lower insulating structure is patterned to form a bottom electrode via (BEVA) opening exposing the one or more lower interconnects. FIG. 9 illustrates a cross-sectional view 900 of some embodiments corresponding to act 2006.

At act 2008, a bottom electrode via structure is formed over within the BEVA opening and over the lower insulating structure. In some embodiments, the bottom electrode via layer may be formed according to acts 2010-2018.

At act 2010, a barrier layer is formed within the BEVA opening and over the lower insulating structure. FIG. 10 illustrates a cross-sectional view 1000 of some embodiments corresponding to act 2010.

At act 2012, an intermediate glue layer is formed within the BEVA opening and over the barrier layer. FIG. 11 illustrates a cross-sectional view 1100 of some embodiments corresponding to act 2012.

At act 2014, a conductive core material is formed within the BEVA opening and over the intermediate glue layer. FIG. 12 illustrates a cross-sectional view 1200 of some embodiments corresponding to act 2014.

At act 2016, a mechanical polishing process is performed to remove parts of the barrier layer, the intermediate glue layer, and/or the conductive core material. FIG. 13 illustrates a cross-sectional view 1300 of some embodiments corresponding to act 2016.

At act 2018, a buffing process is performed without an oxidizer to remove parts of the barrier layer, the intermediate glue layer, and/or the conductive core material to form the bottom electrode via structure. FIG. 14 illustrates a cross-sectional view 1400 of some embodiments corresponding to act 2018.

At act 2020, a bottom electrode layer is formed over the bottom electrode via structure. FIG. 15 illustrates a cross-sectional view 1500 of some embodiments corresponding to act 2020.

At act 2022, a data storage layer is formed over the bottom electrode layer. FIG. 15 illustrates a cross-sectional view 1500 of some embodiments corresponding to act 2022.

At act 2024, a top electrode layer is formed over the data storage layer. FIG. 15 illustrates a cross-sectional view 1500 of some embodiments corresponding to act 2024.

At act 2026, the bottom electrode via structure, the bottom electrode layer, the data storage layer, and the top electrode layer are patterned to form a memory device over a bottom electrode via. FIGS. 16-17 illustrate cross-sectional views 1600-1700 of some embodiments corresponding to act 2026.

At act 2028, an upper interconnect structure is formed on the memory device. FIG. 18 illustrates a cross-sectional view 1800 of some embodiments corresponding to act 2028.

Accordingly, in some embodiments the present disclosure relates to an integrated chip structure comprising a magnetic random-access memory (MRAM) device disposed over a multi-layered bottom electrode via formed using an oxidizer free buffing process. The oxidizer free buffing process mitigates fang defects to provide the bottom electrode via with a substantially flat upper surface, which reduces defects within an overlying data storage structure.

In some embodiments, the present disclosure relates to an integrated chip structure. The integrated chip structure includes a lower insulating structure disposed over a lower dielectric structure surrounding one or more lower interconnects; a bottom electrode via surrounded by one or more interior sidewalls of the lower insulating structure and including a barrier surrounding a conductive core; a bottom electrode arranged on the bottom electrode via; a data storage structure over the bottom electrode; a top electrode over the data storage structure; and the barrier including a sidewall disposed along the one or more interior sidewalls of the lower insulating structure and a horizontally covering segment protruding outward from the sidewall to above a top surface of the lower insulating structure. In some embodiments, the integrated chip structure further includes a glue layer arranged on the barrier, the bottom electrode contacting top surfaces of the glue layer and the barrier. In some embodiments, the barrier has an outer sidewall that is directly below a lower surface of the bottom electrode and directly above the top surface of the lower insulating structure. In some embodiments, the outer sidewall of the barrier is laterally separated from an outer sidewall of the bottom electrode by a non-zero distance. In some embodiments, the top surface of the lower insulating structure laterally extends past an outer sidewall of the barrier. In some embodiments, the barrier has a first thickness along the one or more interior sidewalls and a second thickness directly over the top surface of the lower insulating structure, the first thickness being greater than the second thickness. In some embodiments, the barrier has a third thickness measured along a line that is oriented at an angle of approximately 45° with respect to a top surface of the barrier and that is normal to a surface of the lower insulating structure, the third thickness being greater than the first thickness.

In other embodiments, the present disclosure relates to an integrated chip structure. The integrated chip structure includes a lower insulating structure disposed over one or more lower interconnects, the lower insulating structure having one or more interior sidewalls arranged over the one or more lower interconnects; a bottom electrode via surrounded by the one or more interior sidewalls and including a barrier arranged along the one or more interior sidewalls and over the lower insulating structure; a glue layer arranged on the barrier; a tungsten core arranged on the glue layer; a bottom electrode arranged on the bottom electrode via; a magnetic tunnel junction structure disposed over the bottom electrode; a top electrode disposed over the magnetic tunnel junction structure; and the bottom electrode contacting top surfaces of the barrier, the glue layer, and the tungsten core and being vertically separated from a top surface of the lower insulating structure. In some embodiments, the barrier includes a horizontally covering surface protruding outward form a sidewall of the barrier to over the top surface of the lower insulating structure; and the barrier completely covering opposing outer sidewalls of the glue layer, as viewed in a cross-sectional view. In some embodiments, the tungsten core has a width that changes over a height of the tungsten core, the tungsten core having a maximum width at a location that is a non-zero distance below a top of the tungsten core. In some embodiments, the glue layer and the bottom electrode are a same material.

In yet other embodiments, the present disclosure relates to a method for forming an integrated chip structure. The method includes forming a lower insulating structure over a lower dielectric structure surrounding one or more lower interconnects; patterning the lower insulating structure to form a bottom electrode via opening exposing the one or more lower interconnects; forming a barrier layer within the bottom electrode via opening and over the lower insulating structure; forming a conductive core material over the barrier layer; performing a mechanical polishing process to remove a first part of the conductive core material; performing a buffing process to remove a second part of the conductive core material and to form a conductive core; forming a bottom electrode layer onto the conductive core and the barrier layer; forming a data storage layer onto the bottom electrode layer; and forming a top electrode layer onto the data storage layer. In some embodiments, the method further includes utilizing a focused ion beam etching (FIBE) process to pattern the top electrode layer, the data storage layer, the bottom electrode layer, the barrier layer, and the lower insulating structure. In some embodiments, the FIBE process causes the lower insulating structure to have one or more curved outer sidewalls that face away from the conductive core material and that are coupled to a top surface of the lower insulating structure. In some embodiments, the mechanical polishing process forms a dished region of the conductive core material that is recessed below a top of the barrier layer. In some embodiments, the mechanical polishing process forms one or more fang defects having a first depth arranged along outer edges of the conductive core material. In some embodiments, the buffing process reduces the first depth of the one or more fang defects to a second depth that is less than the first depth. In some embodiments, the buffing process is performed using a slurry that is devoid of an oxidizer. In some embodiments, the method further includes forming an intermediate glue layer onto the barrier layer; and forming the conductive core material onto the intermediate glue layer. In some embodiments, the buffing process causes the barrier layer to have a first thickness within an embedded memory region including the bottom electrode via opening and a second thickness in a peripheral region outside of the embedded memory region, the second thickness being greater than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:
    forming a lower insulating structure over a lower dielectric structure surrounding one or more lower interconnects;
    patterning the lower insulating structure to form a bottom electrode via opening exposing the one or more lower interconnects;
    forming a barrier layer within the bottom electrode via opening and over the lower insulating structure;
    forming a conductive core material over the barrier layer;
    performing a mechanical polishing process to remove a first part of the conductive core material;
    performing a buffing process to remove a second part of the conductive core material and to form a conductive core;
    forming a bottom electrode layer onto the conductive core and the barrier layer;
    forming a data storage layer onto the bottom electrode layer; and
    forming a top electrode layer onto the data storage layer.

2. The method of claim 1, further comprising:
    utilizing a focused ion beam etching (FIBE) process to pattern the top electrode layer, the data storage layer, the bottom electrode layer, the barrier layer, and the lower insulating structure.

3. The method of claim 2, wherein the FIBE process causes the lower insulating structure to have one or more curved outer sidewalls that face away from the conductive core and that are coupled to a top surface of the lower insulating structure.

4. The method of claim 1, wherein the mechanical polishing process forms a dished region of the conductive core material that is recessed below a top of the barrier layer.

5. The method of claim 1, wherein the mechanical polishing process forms one or more fang defects having a first depth arranged along outer edges of the conductive core material.

6. The method of claim 5, wherein the buffing process reduces the first depth of the one or more fang defects to a second depth that is less than the first depth.

7. The method of claim 1, wherein the buffing process is performed using a slurry that is devoid of an oxidizer.

8. The method of claim 1, further comprising:
    forming an intermediate glue layer onto the barrier layer; and
    forming the conductive core material onto the intermediate glue layer.

9. The method of claim 1, wherein the buffing process causes the barrier layer to have a first thickness within an embedded memory region comprising the bottom electrode via opening and a second thickness in a peripheral region outside of the embedded memory region, the second thickness being greater than the first thickness.

10. A method, comprising:
    forming a lower insulating structure over a lower dielectric structure surrounding one or more lower interconnects;
    forming a bottom electrode via opening to extend through the lower insulating structure and expose the one or more lower interconnects;
    forming a barrier layer within the bottom electrode via opening;
    forming a glue layer over the barrier layer;
    forming a conductive core over the glue layer;
    forming a memory device stack over the conductive core, the glue layer, and the barrier layer; and
    patterning the memory device stack and the barrier layer to form a memory device over a barrier and the glue layer, wherein the barrier comprises a sidewall disposed along an interior sidewall of the lower insulating structure and a horizontally extending segment protruding outward from the sidewall to above a top surface of the lower insulating structure, after the patterning is complete.

11. The method of claim 10, wherein the memory device comprises a data storage structure arranged between a top electrode and a bottom electrode, the bottom electrode contacting top surfaces of both the glue layer and the barrier.

12. The method of claim 11, wherein the barrier has an outermost sidewall that is directly below a lower surface of the bottom electrode and directly above the top surface of the lower insulating structure.

13. The method of claim 12, wherein the outermost sidewall of the barrier is laterally separated from an outermost sidewall of the bottom electrode by a non-zero distance.

14. The method of claim 10, wherein the top surface of the lower insulating structure laterally extends past an outermost sidewall of the barrier.

15. A method, comprising:
    forming one or more interconnects within an inter-level dielectric (ILD) structure;
    patterning an upper surface of the ILD structure to form a bottom electrode via opening exposing the one or more interconnects;
    forming a barrier layer within the bottom electrode via opening and over the ILD structure;
    forming a conductive core material over the barrier layer;
    performing a mechanical polishing process to remove a first part of the conductive core material and expose an upper surface of the barrier layer, wherein the upper surface of the barrier layer is directly over the upper surface of the ILD structure after the mechanical polishing process;
    performing a buffing process to remove a second part of the conductive core material and to form a conductive core; and
    forming a memory device over the conductive core.

16. The method of claim 15, further comprising:
    forming an intermediate glue layer over the barrier layer, wherein the conductive core material is formed onto the intermediate glue layer; and
    wherein the mechanical polishing process exposes an upper surface of the intermediate glue layer.

17. The method of claim 16, wherein the mechanical polishing process also removes parts of the barrier layer and the intermediate glue layer.

18. The method of claim 15, wherein the barrier layer comprises a sidewall and a horizontally extending segment protruding outward from the sidewall after the buffing process is completed.

19. The method of claim 15, wherein the mechanical polishing process utilizes a first slurry that comprises an oxidizer and the buffing process utilizes a second slurry that is devoid of an oxidizer.

20. The method of claim 15,
    wherein the conductive core material comprises recessed areas along outer edges of the conductive core material after the mechanical polishing process; and
    wherein the buffing process reduces a depth of the recessed areas.

* * * * *